United States Patent [19]

Ugajin

[11] Patent Number: 5,663,571
[45] Date of Patent: Sep. 2, 1997

[54] QUANTUM MEMORY

[75] Inventor: Ryuichi Ugajin, Kanagawa, Japan

[73] Assignee: Sony Corporation, Tokyo, Japan

[21] Appl. No.: 424,024

[22] Filed: Apr. 18, 1995

[30] Foreign Application Priority Data

Apr. 21, 1994 [JP] Japan .................. 6-106132

[51] Int. Cl.⁶ .................. H01L 29/06; H01L 31/0328; H01L 31/0336
[52] U.S. Cl. .................. 257/17; 257/21; 257/22; 257/25; 365/174
[58] Field of Search .................. 257/17, 22, 21, 257/25; 365/174

[56] References Cited

U.S. PATENT DOCUMENTS

| | | | |
|---|---|---|---|
| 5,073,893 | 12/1991 | Kondou | 257/21 X |
| 5,229,170 | 7/1993 | Narusawa | 427/469 |
| 5,347,140 | 9/1994 | Hirai et al. | 257/25 X |
| 5,436,754 | 7/1995 | Ishihara et al. | 359/240 |
| 5,440,148 | 8/1995 | Nomoto | 257/21 |

*Primary Examiner*—William Mintel
*Attorney, Agent, or Firm*—Harold T. Fujii; Jerry A. Miller

[57] ABSTRACT

A quantum memory has memory cells, each of the memory cells includes three-stage quantum dots stacked in sequence. A memory cell array is constructed by two-dimensionally arranging the memory cells. The quantum dots are made of heterojunctions of compound semiconductors. Writing and reading to and from a memory cell are executed by bringing a needle electrode close to the memory cell to apply an external electric field while irradiating laser light to an area including the memory cell.

26 Claims, 38 Drawing Sheets

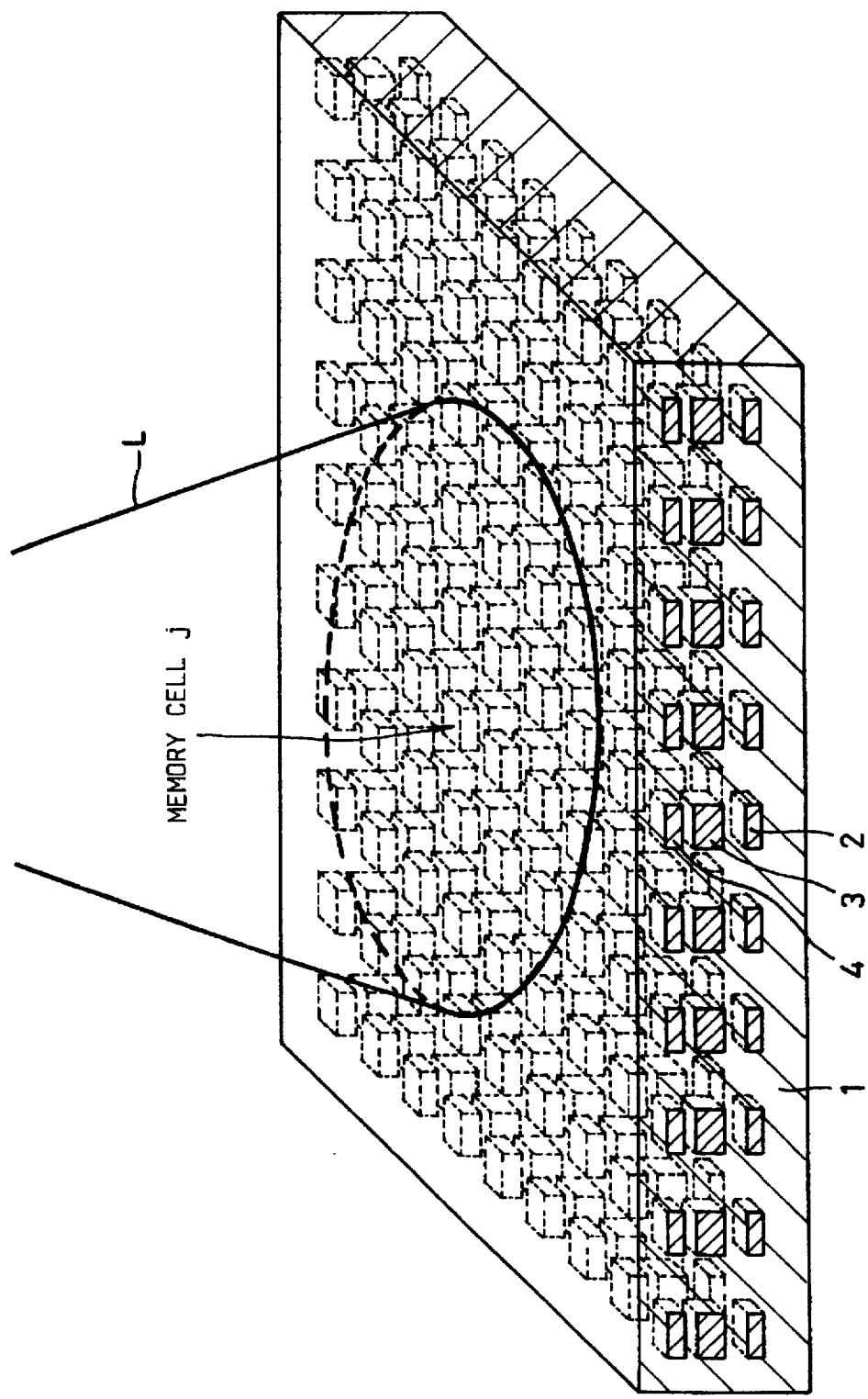

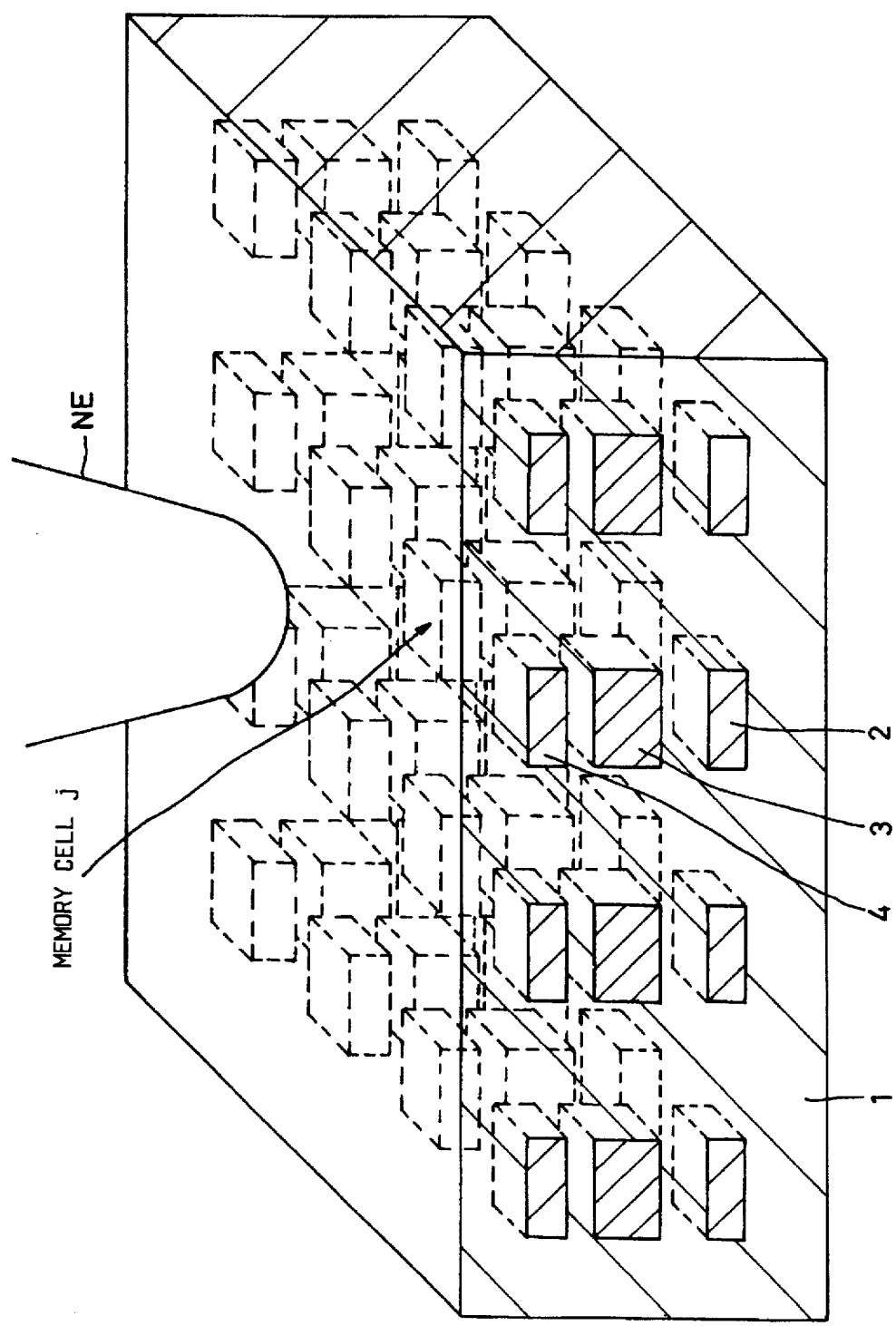

QUANTUM MEMORY

BACKGROUND OF THE INVENTION

This invention relates to a quantum memory and, more particularly, to a quantum memory using quantum boxes (also called quantum dots).

Recently, the rate of integration of semiconductor memory devices, such as dynamic RAM or static RAM, has greatly increased. These semiconductor memory devices are essentially equivalent in that they all use memory cells comprising transistors or capacitors, connect these memory cells by wiring, and access the memory cells through the wiring upon writing and reading data to and from the memory cells.

Regarding of these existing semiconductor memory devices, efforts are being made even now for more improvements of the rate of integration. However, considering that memory cells have the basic structure unchanged and that wiring is indispensable for coupling the memory cells, the efforts will apparently reach the limit of the rate of integration.

OBJECTS AND SUMMARY OF THE INVENTION

It is, therefore, an object of the invention to provide a quantum memory with a high rate of integration, based on a principle of operation completely different from that of existing semiconductor memory devices.

According to the invention, there is provided a quantum memory having a memory cell, the memory cell comprising a first quantum box, a second quantum box and a third quantum box which are stacked in sequence, a coupling strength between the first quantum box and the second quantum box being different from a coupling strength between the second quantum box and the third quantum box.

In one aspect of the invention, the coupling strength between the second quantum box and the third quantum box is larger than the coupling strength between the first quantum box and the second quantum box.

Coupling strength between quantum boxes indicates the ease of for tunnelling of electrons or holes through a barrier between the quantum boxes. The easier the tunnelling, the larger the coupling strength.

In a more preferred aspect of the invention, the first, second and third quantum boxes are designed to establish the relations:

$$E_0^{(j-1)} < E_0^{(j-2)} \tag{1}$$

$$E_0^{(j-3)} < E_0^{(j-2)} \tag{2}$$

$$(E_1^{(j-1)} - E_0^{(j-1)}) > (E_1^{(j-2)} - E_0^{(j-2)}) \tag{3}$$

$$(E_1^{(j-3)} - E_0^{(j-3)}) > (E_1^{(j-2)} - E_0^{(j-2)}) \tag{4}$$

$$(E_0^{(j-1)} - H_0^{(j-1)}) \neq (E_0^{(j-2)} - H_0^{(j-2)}) \tag{5}$$

$$(E_0^{(j-3)} - H_0^{(j-3)}) \neq (E_0^{(j-2)} - H_0^{(j-2)}) \tag{6}$$

where $E_0^{(j-1)}$, $E_0^{(j-2)}$ and $E_0^{(j-3)}$ are ground-state energy levels of electrons in the first quantum box, second quantum box and third quantum box, respectively; $E_1^{(j-1)}$, $E_1^{(j-2)}$ and $E_1^{(j-3)}$ are energy levels of electrons in a first excited-state of the first quantum box, second quantum box and third quantum box, respectively; $H_0^{(j-1)}$, $H_0^{(j-2)}$ and $H_0^{(j-3)}$ are ground-state energy levels of holes in the first quantum box, second quantum box and third quantum box, respectively; and $H_1^{(j-1)}$, $H_1^{(j-2)}$ and $H_1^{(j-3)}$ are energy levels of holes in a first excited-state of the first quantum box, second quantum box and third quantum box, respectively.

In another preferred aspect of the invention, the first, second and third quantum boxes are designed to establish the relations:

$$E_0^{(j-1)} < E_0^{(j-2)} \tag{7}$$

$$E_0^{(j-3)} < E_0^{(j-2)} \tag{8}$$

In the quantum memory according to the invention, during writing, a first external electric field in the stacking direction of the first, second and third quantum boxes is preferably applied to a memory cell chosen for writing while irradiating first light to the memory cell. Preferably, a monochromatic light having a photon energy slightly smaller than the electron-hole pair generation energy in the second quantum box with no external electric field applied is used as the first light. The strength of the first external electric field is determined so as to effectively decrease the electron-hole pair generation energy in the second quantum box due to the Stark shift and to cause resonant absorption of the first light and generation of electron-hole pairs in the second quantum box.

On the other hand, during reading of the quantum memory according to the invention, a second external electric field in the opposite direction from that of the first external electric field is applied to a memory cell chosen for reading while irradiating second light to the memory cell. Preferably, a monochromatic light with a photon energy equal to the difference $(E_1^{(j-2)} - E_0^{(j-2)})$ between the ground-state energy level $E_0^{(j-2)}$ and the first excited-state energy level $E_1^{(j-2)}$ of an electron in the second quantum box is used as the second light. The strength of the second external electric field is determined such that the ground-state energy level $E_0^{(j-3)}$ of an electron in the third quantum box and the ground-state energy level $E_0^{(j-2)}$ of an electron in the second quantum box coincide with each other due to bending of the energy band.

In the quantum memory according to the invention, the first external electric field and the second external electric field are preferably applied by applying a predetermined voltage to a needle electrode and by bringing the needle electrode close to a memory cell chosen for writing or reading.

In the quantum memory according to the invention, initialization (or erasure) of a specific memory cell is attained by applying to the memory cell a third external electric field larger than the second external electric field or applying the second external electric field for a longer time than the time for reading so as to cause electron-hole recombination in the memory cell.

When all memory cells are to be initialized simultaneously, the temperature of the quantum memory is increased, or the third light is irradiated to the quantum memory, so as to cause electron-hole recombination in all memory cells.

In the quantum memory according to the invention, the first quantum box, second quantum box and third quantum box are made by heterojunctions of compound semiconductors. Typical heterojunctions of compound semiconductors are superlattices of type-I heterojunctions; more specifically, AlGaAs/GaAs heterojunctions or AlGaAs/InGaAs heterojunctions, for example. Alternatively, the compound semiconductor heterojunctions my be superlattices of type-II heterojunctions; more specifically, AlSb/InAs heterojunctions, GaSb/InAs heterojunctions or AlSb/GaSb heterojunctions, for example.

In the quantum memory having the above-described structure according to the invention, a single memory cell comprises three, namely, first to third, quantum boxes stacked in sequence, unlike memory cells in an existing semiconductor memory, such that writing and reading to and from the memory cells can be done by concurrently utilizing irradiation of light or application of an external electric field through a needle electrode. That is, the quantum memory needs no wiring for coupling memory cells, and can execute writing and reading without wiring. Therefore, the limit to the rate of integration caused by wiring is removed, and a sole limit to the rate of integration depends upon on an effective area occupied by each cell. Moreover, each cell occupies only an effective area as small as 50 nm×50 nm=$25\times10^{-16}$ m², which is much smaller than the effective area occupied by each cell in an existing semiconductor memory.

The above, and other, objects, features and advantage of the present invention will become readily apparent from the following detailed description thereof which is to be read in connection with the accompanying drawings.

BRIEF DESCRIPTION OF THE DRAWINGS

FIG. 4 is a perspective view of the quantum memory according to the first embodiment of the invention, taken for explaining a writing method;

FIG. 6 is a perspective view for explaining a method of writing into the quantum memory according to the first embodiment of the invention;

DETAILED DESCRIPTION OF THE PREFERRED EMBODIMENTS

Some embodiments of the invention are explained below with reference to the drawings.

Figure 1:
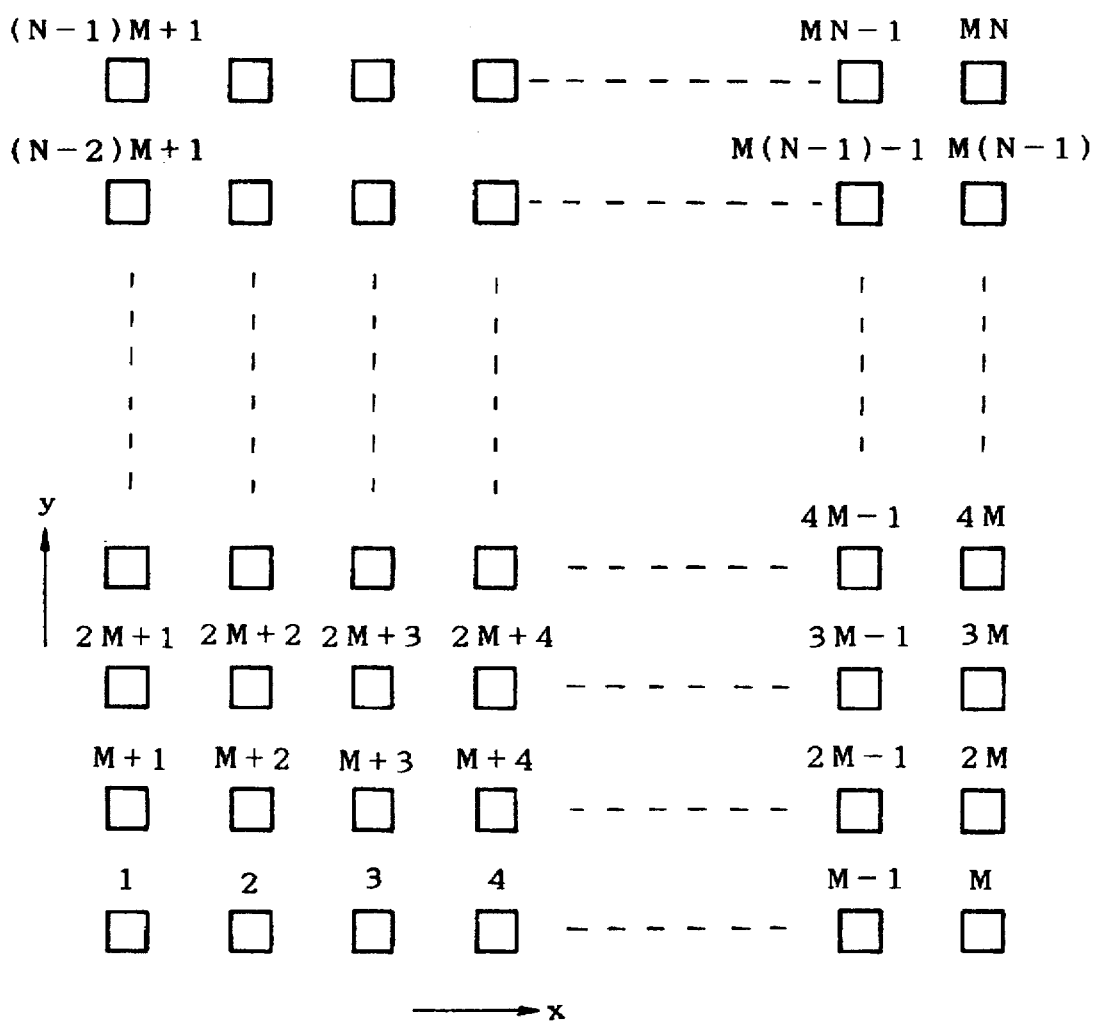
FIG. 1 is a schematic diagram conceptually illustrating a quantum memory according to a first embodiment of the invention.

FIG. 1 conceptually illustrates a quantum memory according to a first embodiment of the invention. As shown in FIG. 1, the quantum memory according to the first embodiment contains memory cells arranged in the x and y directions to make up a memory cell array. The memory cell array contains M memory cells in the x-direction and N memory cells in the y-direction, that is, MN memory cells in total. These memory cells are labelled with sequential numbers from 1 to MN. Each memory cell comprises three quantum dots aligned in three stages as explained later in greater detail.

Figure 2:
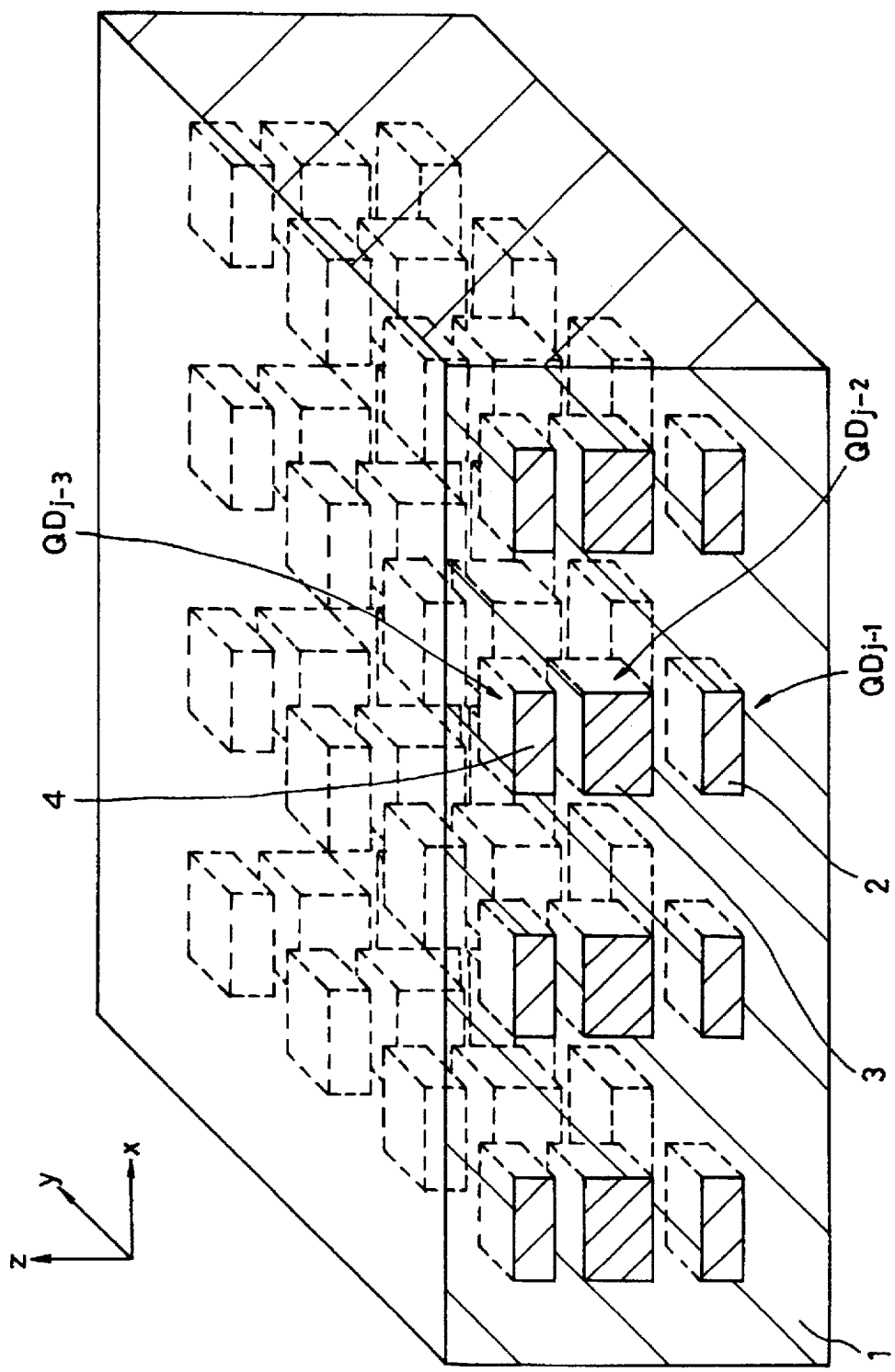
FIG. 2 is a perspective view of the quantum memory according to the first embodiment of the invention.

FIG. 2 shows a part of the memory cell array of the quantum memory according to the invention in a perspective view.

In FIG. 2, reference numeral 1 denotes an AlGaAs layer as a barrier layer. In the AlGaAs layer 1, box-shaped InGaAs layers 2 as quantum well layers are arranged in an array of a predetermined pattern on a first plane parallel to the x-y plane, box-shaped GaAs layers 3 as quantum well layers are arranged on a second plane parallel to the x-y plane in an array of the same pattern as that of the underlying InGaAs layers 2, and box-shaped InGaAs layers 4 are arranged on a third plane parallel to the x-y plane in an array of the same pattern as those of the underlying GaAs layers 3 and the InGaAs layers 2. These InGaAs layers 2, GaAs layers 3 and InGaAs layers 4 are embedded in the AlGaAs layer 1 behaving as a barrier layer.

In this case, each quantum dot in the lower stage in FIG. 2, i.e. in the first stage, is formed by the structure where each InGaAs layer 2 as a quantum well layer is surrounded by the AlGaAs layer 1 as a barrier layer. Each quantum dot in the middle stage in FIG. 2, i.e. in the second stage, is formed by the structure where each GaAs layer 3 as a quantum well layer is surrounded by the AlGaAs layer 1 as a barrier layer. Each quantum dot in the upper stage in FIG. 2, i.e. in the third stage, is formed by the structure where each InGaAs layer 4 as a quantum well layer is surrounded by the AlGaAs layer 1 as a barrier layer. A quantum dot in the first stage, a quantum dot in the second stage and a quantum dot in the third stage, successively aligned in the z direction, make one memory cell. In the following explanation, a j-numbered memory cell is identified as memory cell j, its first-stage quantum dot as $QD_{j-1}$, its second-stage quantum dot as $QD_{j-2}$, and its third-stage quantum dot as $QD_{j-3}$, respectively.

Both the AlGaAs/InGaAs heterojunction making the first-stage quantum dot $QD_{j-1}$ and the third-stage quantum dot $QD_{j-3}$ and the AlGaAs/GaAs heterojunction making the second-stage quantum dot $QD_{j-2}$ are superlattices with so-called type-I heterojunctions.

Here the z-directional width of the InGaAs layer 2 as the quantum well layer of the quantum dot $QD_{j-1}$ is expressed as $W_1$, the z-directional width of the GaAs layer 3 as the quantum well layer of the quantum dot $QD_{j-2}$ is expressed as $W_2$, the z-directional width of the InGaAs layer 4 as the quantum well layer of the quantum dot $QD_{j-3}$ is expressed as $W_3$, the depth of the potential well in the conduction band of the InGaAs layer 2 as the quantum well layer of the quantum dot $QD_{j-1}$ is expressed as $V_1$, the depth of the potential well in the conduction band of the GaAs layer 3 as the quantum well layer of the quantum dot $QD_{j-2}$ is expressed as $V_2$, and the depth of the potential well in the conduction band of the InGaAs layer 4 as the quantum well layer of the quantum dot $QD_{j-3}$ is expressed as $V_3$. Also, the z-directional width of the AlGaAs 1 as the barrier layer between the InGaAs layer 2 as the quantum well layer of the quantum dot $QD_{j-1}$ and the GaAs layer 3 as the quantum well layer of the quantum dot $QD_{j-2}$ is expressed as $B_{12}$, and the z-directional width of the AlGaAs layer 1 as the barrier layer between the GaAs layer 3 as the quantum well layer of the quantum dot $QD_{j-2}$ and the InGaAs layer 4 as the quantum well layer of the quantum dot $QD_{j-3}$ is expressed as $B_{23}$. Further, the ground-state energy level and the first excited-state energy level of an electron in the quantum dot $QD_{j-k}$ (k=1, 2, 3) are expressed as $E_0^{(j-k)}$ and $E_1^{(j-k)}$, respectively, and the ground-state energy level and the first excited-state energy level of a hole in the quantum dot $QD_{j-k}$ (k=1, 2, 3) are expressed as $H_0^{(j-k)}$ and $H_1^{(j-k)}$ respectively.

Then, in the quantum memory according to the first embodiment, quantum dots $QD_{j-1}$, $QD_{j-2}$ and $QD_{j-3}$ constituting the memory cell j are designed to satisfy the following equations:

$$W_2 > W_1 \sim W_3 \tag{9}$$

$$V_2 < V_1 \sim V_3 \tag{10}$$

$$B_{12} > B_{23} \tag{11}$$

$$E_0^{(j-1)} \sim E_0^{(j-3)} < E_0^{(j-3)} \tag{12}$$

$$(E_1^{(j-1)} - E_0^{(j-1)}) \sim (E_1^{(j-3)} - E_0^{(j-3)}) > (E_1^{(j-2)} - E_0^{(j-2)}) \tag{13}$$

$$(E_0^{(j-1)} - H_0^{(j-1)}) \sim (E_0^{(j-3)} - H_0^{(j-3)}) \neq (E_0^{(j-2)} - H_0^{(j-2)}) \tag{14}$$

Examples of values of $W_1$, $W_2$, $W_3$, $B_{12}$, and $B_{23}$ are $W_1 \sim 10$ nm, $W_2 \sim (10\sim15)$nm, $W_3 \sim 10$ nm, $B_{12} \sim 12$ nm, and $B_{23} \sim 8$ nm. The size of each quantum dot $QD_{j-k}$ (k=1, 2, 3) on a plane parallel to the x-y plane is ~10 nm, for example, and the distance between respective adjacent quantum dots is ~50 nm, for example.

Figure 3:
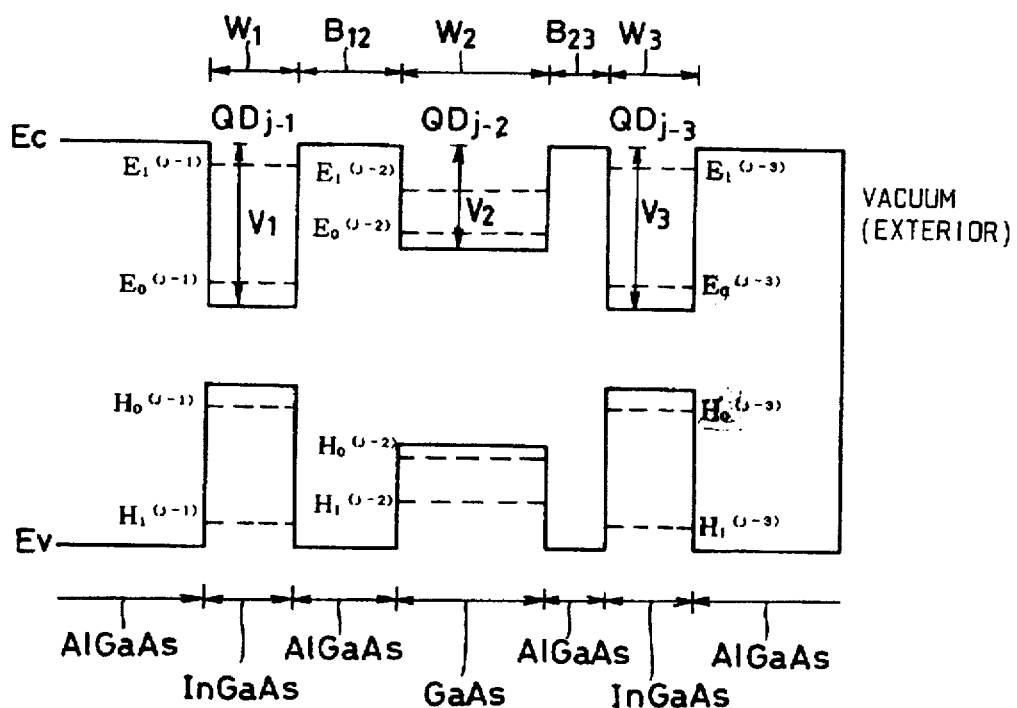
FIG. 3 is an energy band diagram of the quantum memory according to the first embodiment of the invention.

FIG. 3 shows an energy band diagram of the memory cell j along the stacking direction of the quantum dot $QD_{j-k}$. In FIG. 3, $E_c$ and $E_v$ denote the bottom energy of the conduction band and the top energy of the valence band, respectively (and so forth).

Explained below is the principle of operation of the quantum memory having the above-described structure according to the first embodiment. As described later in greater detail, monochromatic light, specifically a laser beam, is irradiated during writing or reading to a memory cell chosen for writing or reading. Since the laser beam must have a photon energy corresponding to the distance between energy levels of an electron in different bands of the quantum dot (about 1 eV) or to the distance between energy levels of an electron between subbands (about 0.3 eV), the laser beam having a photon energy of this rate makes a spot size of several micrometers or more, and hence irradiates a wide area including not only the memory cell chosen for writing or reading but also a number of other memory cells. In order to ensure properly selective writing or reading only of a specific memory cell among a number of memory cells irradiated by the laser beam, an external electric field is applied to the specific memory cell by using a needle electrode similar to a scanning needle of a scanning tunnel microscope.

Figure 5:
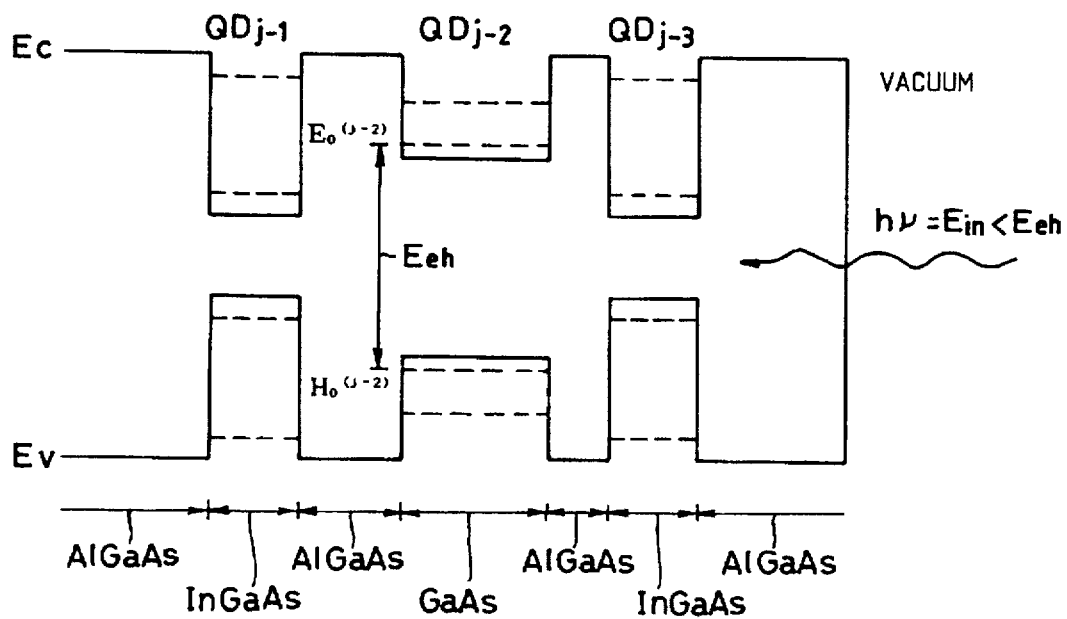
FIG. 5 is an energy band diagram for explaining a method of writing into the quantum memory according to the first embodiment of the invention.

For writing of the quantum memory according to the first embodiment, laser beam L is held irradiated to an area including a memory cell chosen for writing as shown in FIG. 4. In this state, no external electric field is applied to any of the memory cells. The laser beam L used has a smaller photon energy (longer wavelength) than the electron-hole pair generation energy, $E_{eh}$, in the second-stage quantum dot $QD_{j-2}$ with no external electric field applied through a needle electrode NE explained later. That is, if the photon energy of the laser beam L is $h\nu = E_{in}$, then $E_{in} < E_{eh}$. In this state, no electron-hole pair is generated in the quantum dot $QD_{j-2}$ by irradiation of the laser beam L, and light absorption does not occur (FIG. 5).

Figure 7:
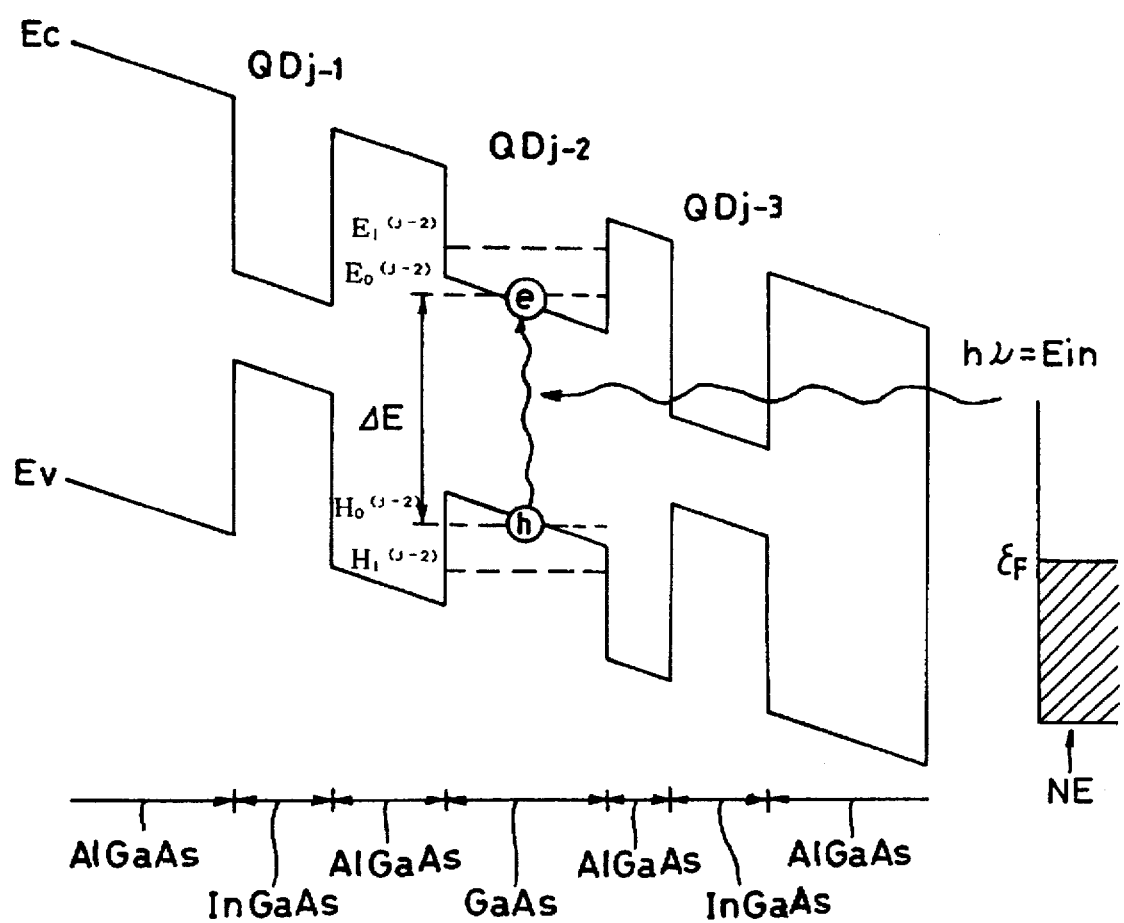
FIG. 7 is an energy band diagram for explaining a method of writing into the quantum memory according to the first embodiment of the invention.

In the state where the laser beam L is irradiated to the area including the memory cell j chosen for writing as stated above, an external electric field is applied by bringing close to the memory cell j the needle electrode NE with a positive voltage relative to the quantum memory applied as shown in FIG. 6. The resulting energy band diagram of the memory cell j is as shown in FIG. 7. When such external electric field is applied, $$\Delta E = E_0^{(j-2)} - H_0^{(j-2)} \tag{15}$$

decreases by the Stark shift. If the magnitude of the external electric field satisfies $\Delta E = E_{in}$, resonant absorption of the laser beam L occurs, and an electron-hole pair is produced in the quantum dot $QD_{j-2}$ (FIG. 7). The Stark shift is advantageously large due to the existence of the upper and lower quantum dots $QD_{j-1}$ and $Q_{j-3}$ in comparison with a case of a single quantum dot $QD_{j-2}$.

Figure 8:
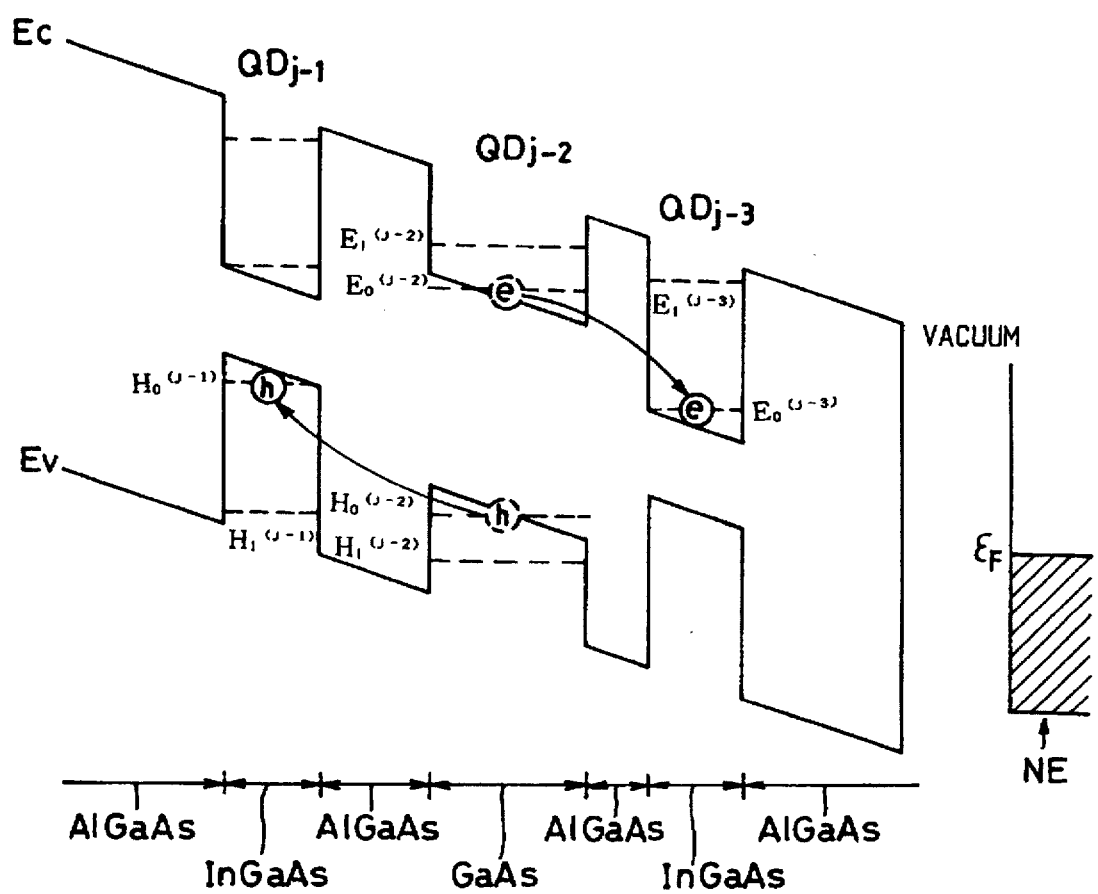
FIG. 8 is an energy band diagram for explaining a method of writing into the quantum memory according to the first embodiment of the invention.

As shown in FIG. 8, due to the external electric field applied in the z direction, the electron of the electron-hole pair generated in the quantum dot $QD_{j-2}$ quickly moves into the quantum dot $QD_{j-3}$, and the hole to the quantum dot $QD_{j-1}$. Then the electron having moved into the quantum dot $QD_{j-3}$ relaxes to the ground-state energy level $E_0^{(j-3)}$ with a lower energy, the hole having moved into the quantum dot $QD_{j-1}$ relaxes to the ground-state energy level $H_0^{(j-1)}$ with a lower energy, and they are spatially isolated from each other.

Figure 9:
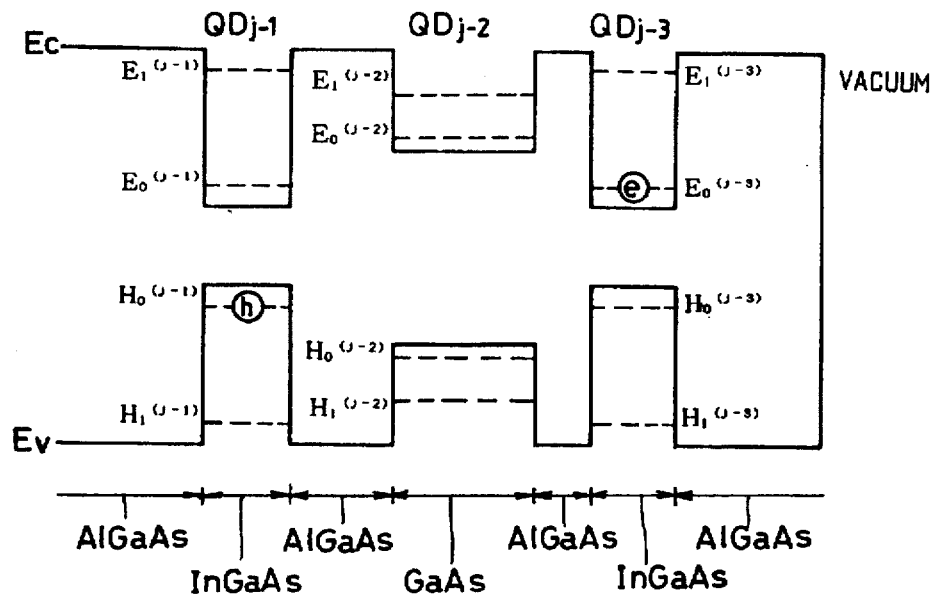
FIG. 9 is an energy band diagram after writing into the quantum memory according to the first embodiment of the invention.

After that, the external electric field is removed by withdrawing the needle electrode NE from the memory cell j. Since the electron and the hole in the memory cell j are spatially distant from each other, they remain stable without being recombined (FIG. 9). As shown in FIG. 9, the state established by the entry of the electron into the quantum dot $QD_{j-3}$ and the entry of the hole into the quantum dot $QD_{j-1}$ exhibits that one bit has been stored.

Since the external electric field applied through the needle electrode NE is weak in the other memory cells also exposed to the laser beam L, the Stark shift is not large enough to cause light absorption, and no electron-hole pair is generated in these other memory cells. That is, the electron-hole pair is generated only in the memory cell j, and one bit of information is stored there.

Figure 10:
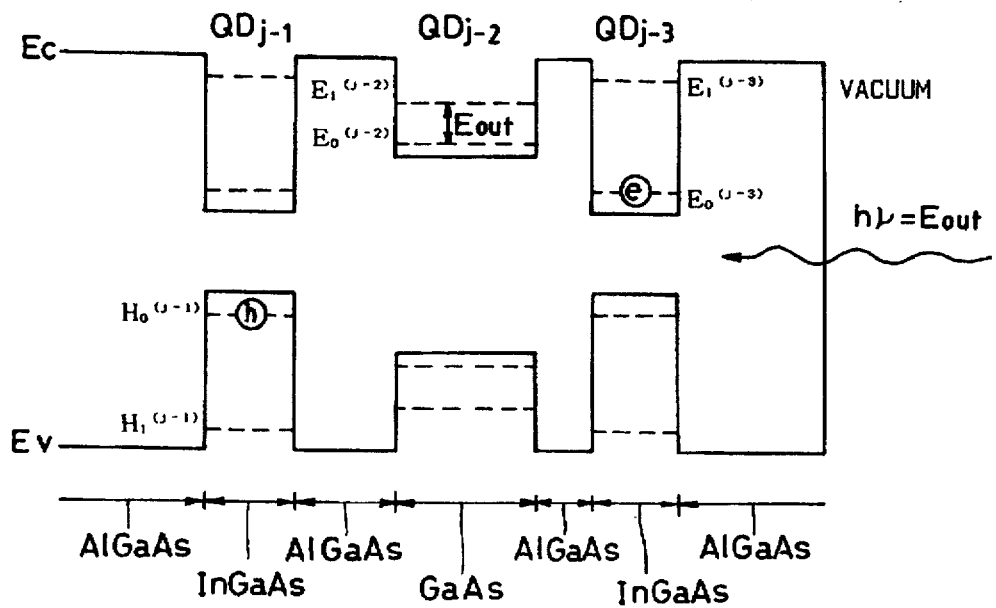
FIG. 10 is an energy band diagram for explaining a method of reading from the quantum memory according to the first embodiment of the invention.

Explained below is a process of reading from the quantum memory according to the first embodiment. Assume here that an electron is in the ground-state energy level $E_0^{(j-3)}$ of an electron in the quantum dot $QD_{j-3}$ of the memory cell j and that a hole is in the ground-state energy level $H_0^{(j-1)}$ of a hole in the quantum dot $QD_{j-1}$ (FIG. 10).

For reading, in the same manner as shown in FIG. 4, the laser beam L is held irradiated to an area including the memory cell j chosen for reading. The laser beam L used here has a photon energy $h\nu$ equal to the difference between the ground-state energy level $E_0^{(j-2)}$ of the electron in the quantum dot $QD_{j-2}$ and the first-excitation-state energy level $E_1^{(j-2)}$ of the electron in the quantum dot $QD_{j-2}$, shown below.

$$E_{out} = E_1^{(j-2)} - E_0^{(j-2)} \tag{16}$$

Figure 11:
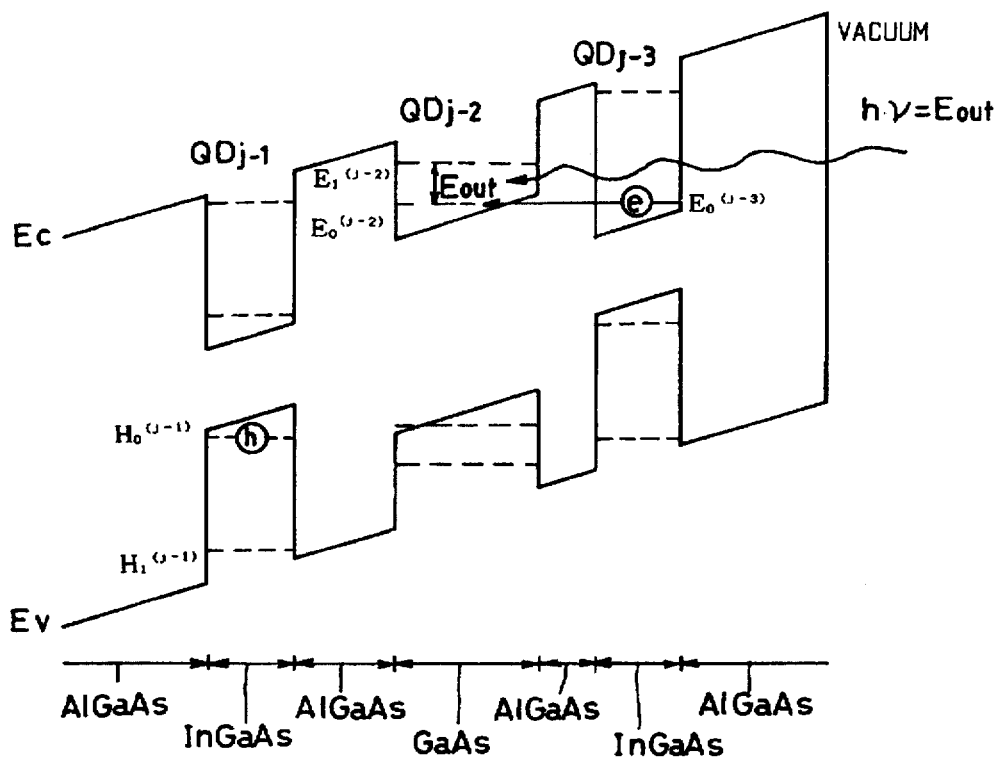
FIG. 11 is an energy band diagram for explaining a method of reading from the quantum memory according to the first embodiment of the invention.

Even when the laser beam L having the photon energy $h\nu$ equal to $E_{out}$ is irradiated to the memory cell j, light absorption does not occur because an electron, if any in the memory cell j, exists in the quantum dot $QD_{j-3}$. Therefore, in the same manner as shown in FIG. 6, an external electric field is applied by bringing close to the memory cell j the needle electrode NE applied with a negative voltage relative to the quantum memory, opposite to that for writing. The resulting energy band diagram of the memory cell j is shown in FIG. 11.

When the external electric field has a strength substantially equal to $E_0^{(j-3)}$ and $E_0^{(j-2)}$, it produces a probability that the electron resonantly moves to the second-stage quantum dot $QD_{j-2}$ and only then causes absorption of the laser beam L of $h\nu=E_{out}$. In this case, since the width $B_{12}$ of the AlGaAs layer 1 as the barrier layer between the quantum dots $QD_{j-1}$ and $QD_{j-2}$ is different from the width $B_{23}$ of the AlGaAs layer 1 as the barrier layer between the quantum dots $QD_{j-2}$ and $QD_{j-3}$ as $$B_{12} > B_{23} \qquad (17)$$

the electron having moved from the quantum dot $QD_{j-3}$ to the quantum dot $QD_{j-2}$ does not move far to the quantum dot $QD_{j-1}$. The hole in the quantum dot $QD_{j-1}$ does not move but remains in the quantum dot $QD_{j-1}$. The reason why the hole in the quantum dot $QD_{j-1}$ does not move is that the time necessary for tunneling of the hole through the InGaAs layer 1 as the barrier layer having the width $B_{12}$ is overwhelmingly larger than the time necessary for tunneling of the electron through the AlGaAs layer 1 as the barrier layer having the width $B_{23}$. This relies not only on the difference between $B_{12}$ and $B_{23}$ but also on the effective mass of the hole being larger than the effective mass of the electron.

If no electron and hole exists in the memory cell j, light absorption does not occur even when it is irradiated with the laser beam L. Therefore, bit information can be read from the memory cell through presence or absence of light absorption.

It is recognized that, similarly to the writing process, the external electric field applied through the needle electrode NE is weak in the other memory cells also exposed to the laser beam L; the electron in the memory cell, if any, cannot move to the second-stage quantum dot; no light absorption occurs; and only information from the memory cell j can be read out selectively.

Explained below is a method of initializing (or erasing) the quantum memory according to the first embodiment. There are two methods of initializing particular memory cell. One of them is to cause electron-hole recombination in the memory cell j to be initialized, by applying an external electric field to the memory cell j through the needle electrode NE applied with a negative voltage larger than that for reading and brought close to the memory cell j. The other method is to induce electron-hole recombination in the memory cell j by applying an external electric field as large as that for reading, for example, for longer time. It is also possible, in some cases, to initialize a particular memory cell by applying an alternating electric field through the needle electrode NE.

Figure 12:
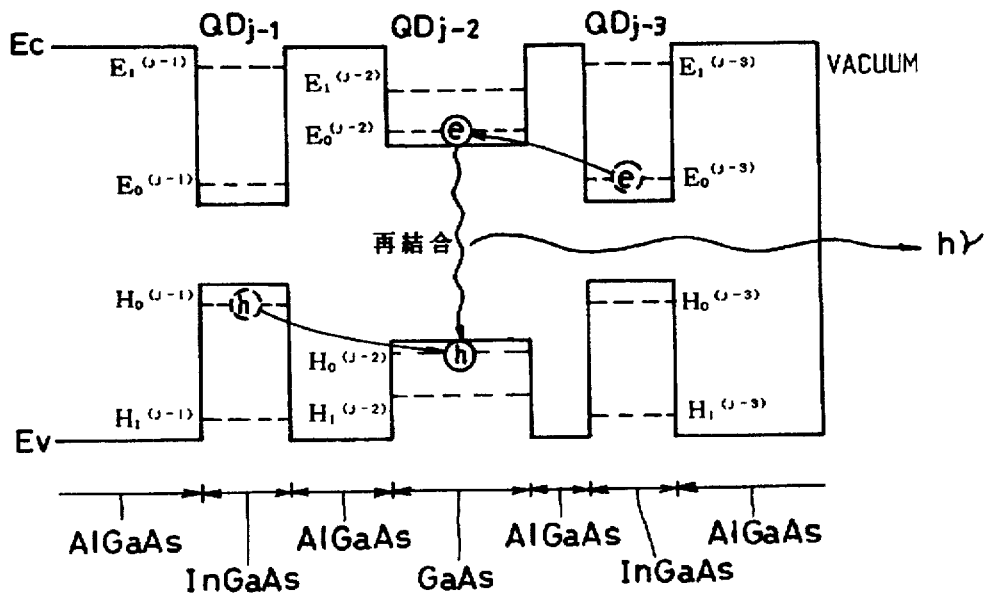
FIG. 12 is an energy band diagram for explaining a method of initializing the quantum memory according to the first embodiment of the invention.

For initializing all memory cells simultaneously, a method of increasing the temperature of the quantum memory to promote electron-hole recombination by absorption of phonons. An appropriate temperature T of the quantum memory for this purpose is high enough to thermally excite a hole in the ground-state energy level $H_0^{(j-1)}$ of a hole in the quantum dot $QD_{j-1}$ to the ground-state energy level $H_0^{(j-2)}$ of a hole in the quantum dot $QD_{j-2}$, and an electron in the ground-state energy level $E_0^{(j-3)}$ of an electron in the quantum dot $QD_{j-3}$ to the ground-state energy level $E_0^{(j-2)}$ of an electron in the quantum dot $QD_{j-2}$, respectively, as shown in FIG. 12. More specifically, it is in the range satisfying $$(H_0^{(j-2)} - H_0^{(j-1)}) - (E_0^{(j-2)} - E_0^{(j-3)}) \sim k_B T \qquad (18)$$

Another method of initializing all memory cells simultaneously is to irradiate monochromatic light with a photon energy defined by equation (18) to the entirety of the quantum memory, thus exciting electrons in third-stage quantum dots and holes in first-stage quantum dots in all memory cells into second-stage quantum dots, and causing electron-hole recombination.

Explained below is a method for manufacturing the quantum memory having the above-described structure according to the first embodiment.

Figure 13:
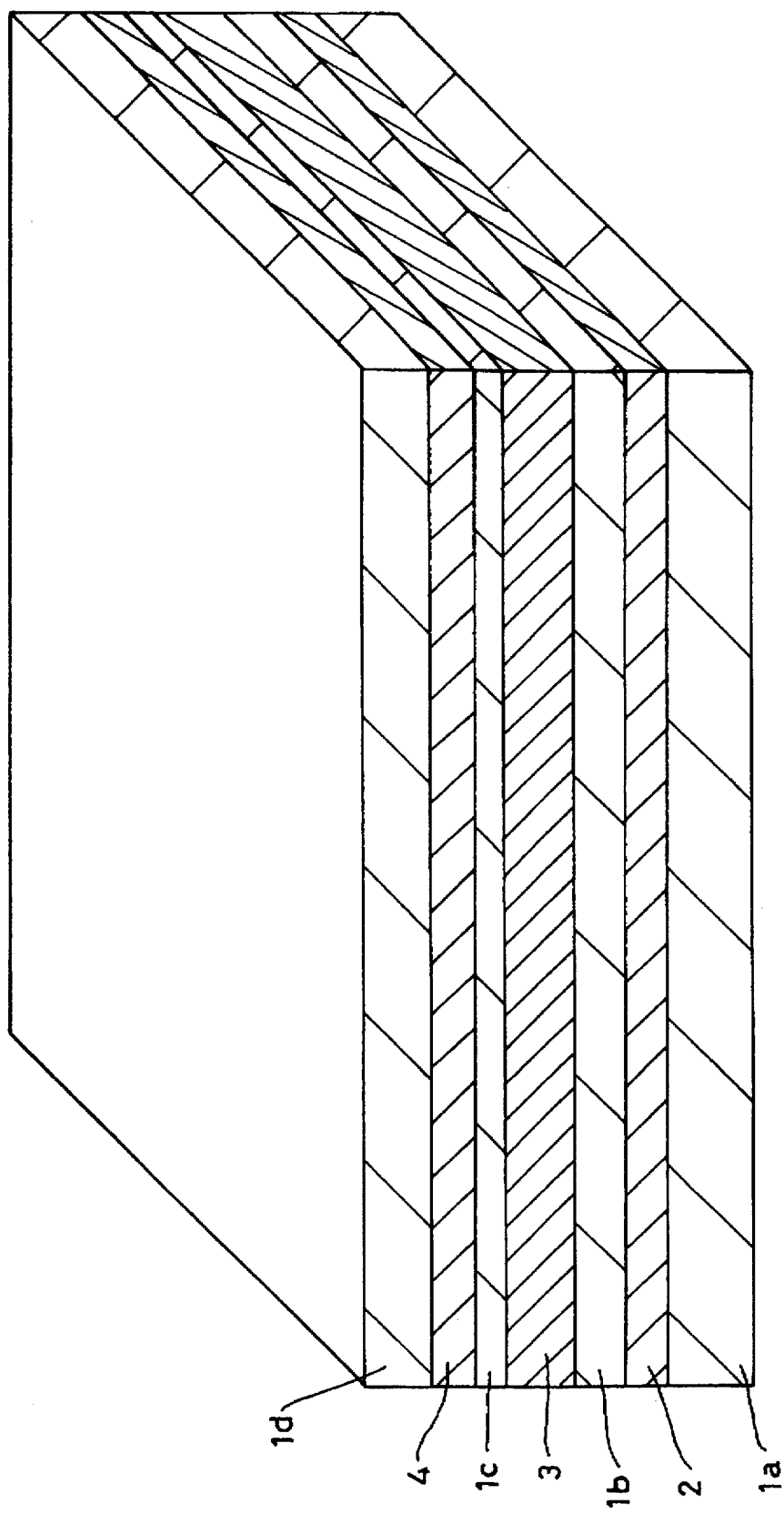
FIG. 13 is a perspective view for explaining a process for manufacturing the quantum memory according to the first embodiment of the invention.

As shown in FIG. 13, epitaxial layers grown on a compound semiconductor substrate such as GaAs substrate (not shown) are, in sequence, a sufficiently thick AlGaAs layer 1a, InGaAs layer 2 having the thickness $W_1$, AlGaAs layer 1b having the thickness $B_{12}$, GaAs layer 3 having the thickness $W_2$, AlGaAs layer 1c having the thickness $B_{23}$, InGaAs layer 4 having the thickness $W_3$, and AlGaAs layer 1d of a predetermined thickness, by metallorganic chemical vapor deposition (MOCVD) or molecular beam epitaxy (MBE), for example. It is easy for the current MOCVD or MBE method to control the epitaxial growth such that $W_1$, $W_2$, $W_3$, $B_{12}$ and $B_{23}$ satisfy Equations (9) and (11). It is also possible to control the epitaxial growth by regulating the composition ratio of In in the InGaAs layers 2 and 4 and the composition ratio of Al in the AlGaAs layers 1a, 1b, 1c and 1d such that the potential well depth $V_1$ in the conduction band of the InGaAs layer 2 as the quantum well layer of the quantum dot $QD_{j-1}$, the potential well width $V_2$ in the conduction band of the InGaAs layer 3 as the quantum well layer of the quantum dot $QD_{j-2}$ and the potential well width $V_3$ in the conduction band of the InGaAs layer 4 as the quantum well layer of the quantum dot $QD_{j-3}$ satisfy Equation (10).

Figure 14:
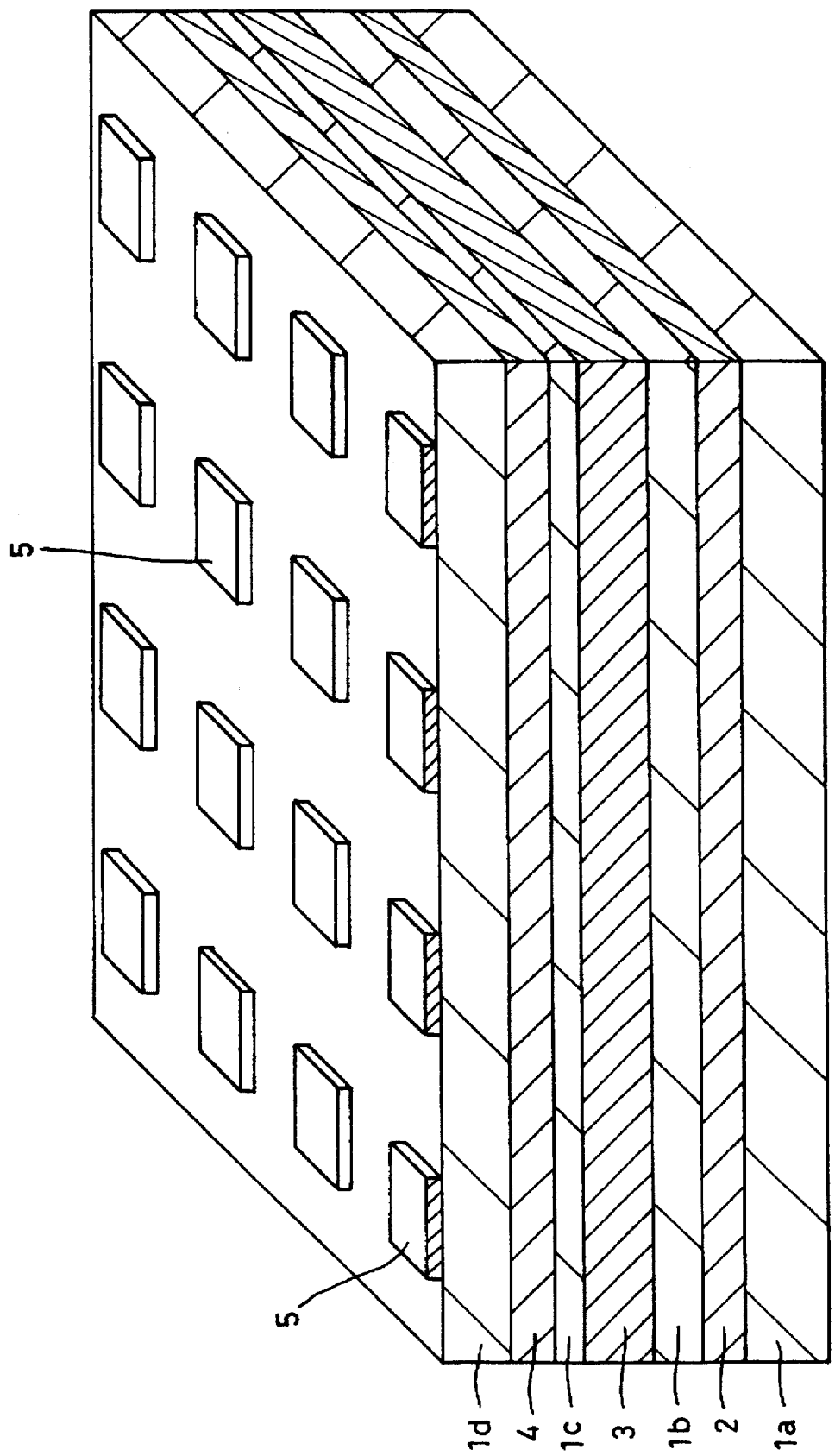
FIG. 14 is a perspective view for explaining a process for manufacturing the quantum memory according to the first embodiment of the invention.

Next, as shown in FIG. 14, a resist pattern 5 with a shape corresponding to memory cells is formed on the AlGaAs layer 1d by electron beam lithography, for example.

Figure 15:
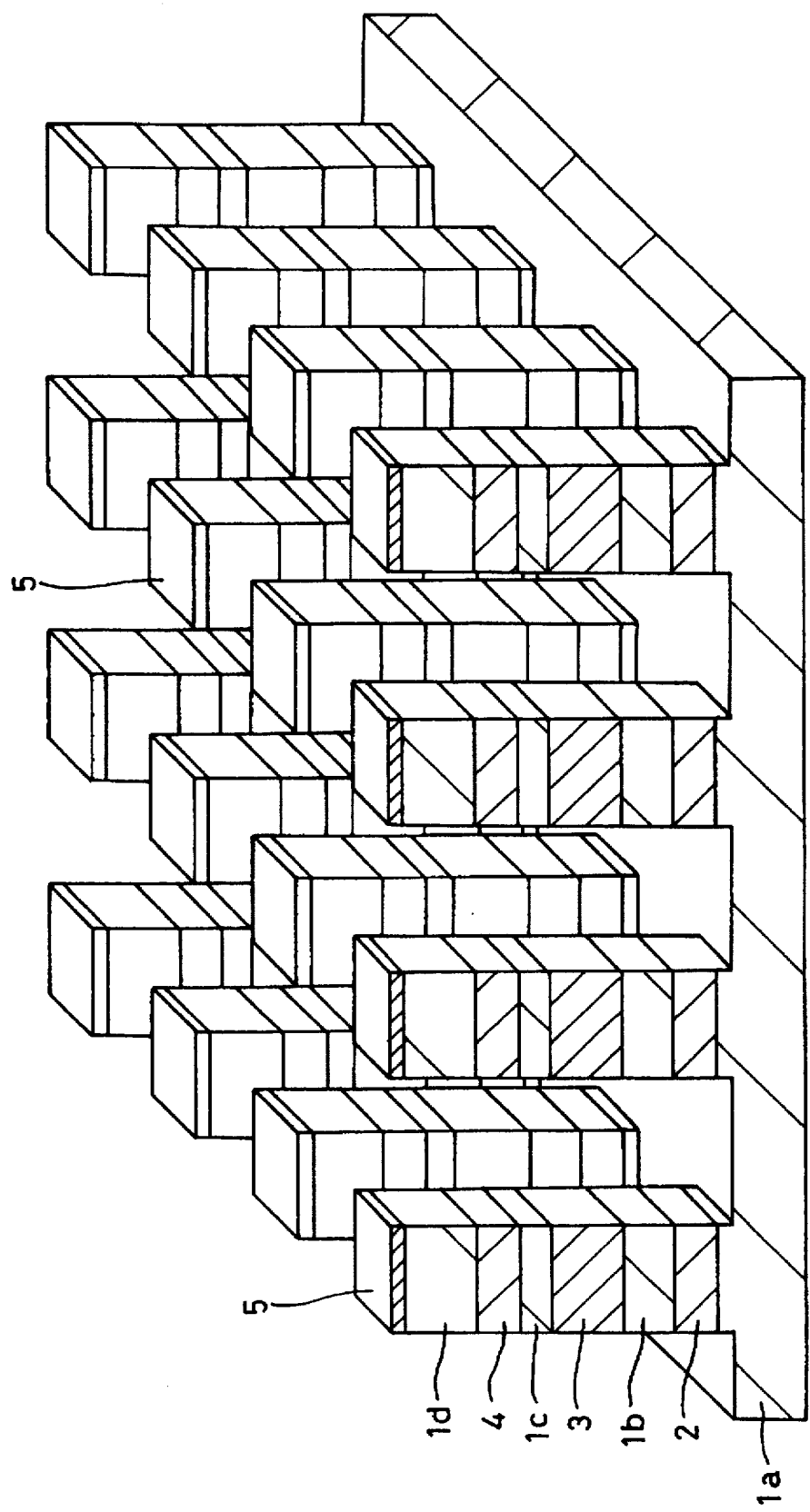
FIG. 15 is a perspective view for explaining a process for manufacturing the quantum memory according to the first embodiment of the invention.

By using the resist pattern 5 as a mask, The AlGaAs layer 1d, InGaAs layer 4, AlGaAs layer 1c, GaAs layer 3, AlGaAs layer 1b and InGaAs layer 2 are selectively etched off in sequence in the vertical direction relative to the plane of the substrate by reactive ion etching (RIE), for example. This etching is done to a slightly over-etching extent so as to separate the InGaAs layers 2 from each other. As a result, as shown in FIG. 15, the InGaAs layer 2, AlGaAS layer 1b, GaAs layer 3, AlGaAs layer 1c, InGaAs layer 4 and AlGaAs layer 1d are patterned into quadrangular prisms.

Figure 16:
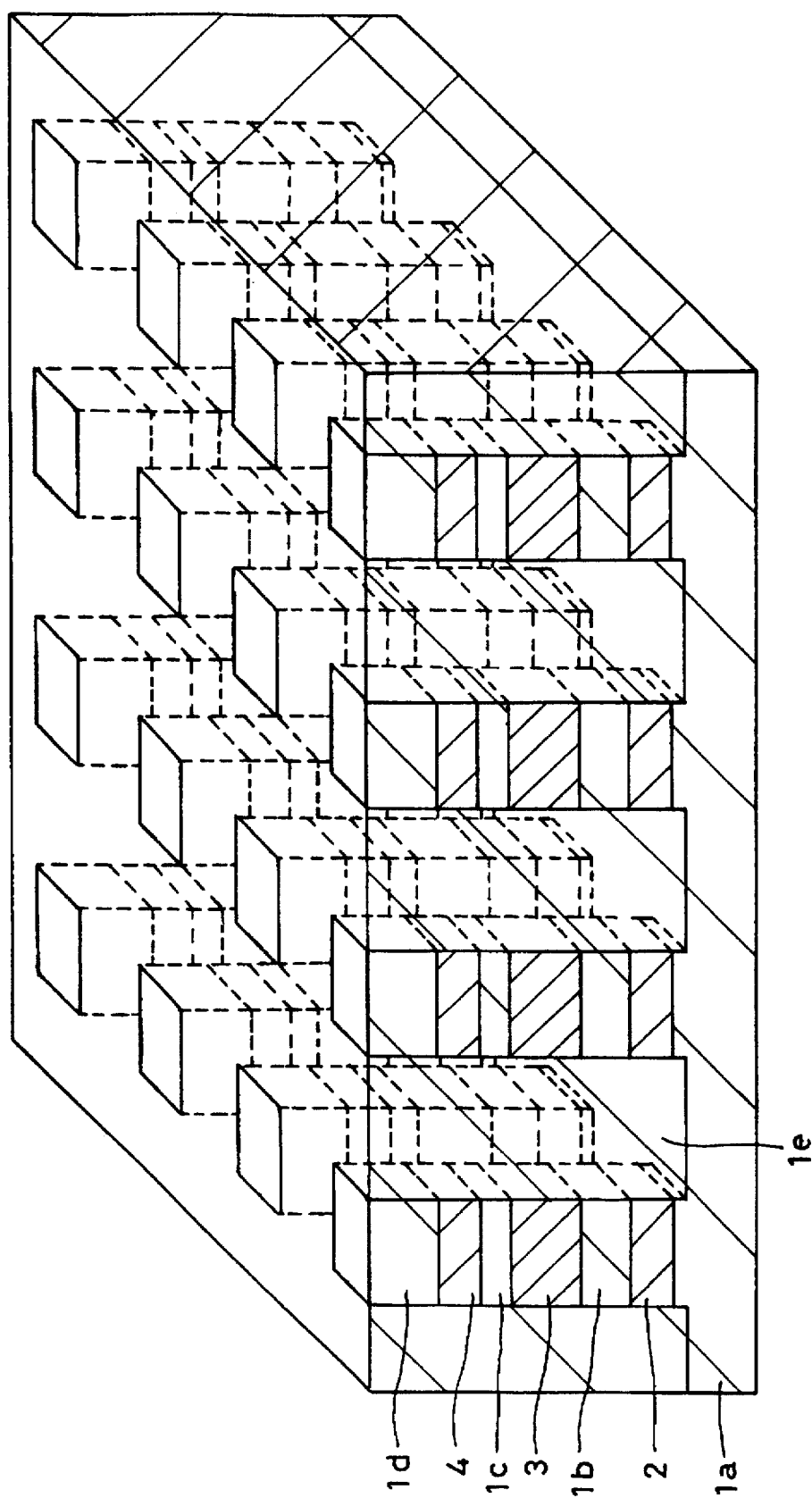
FIG. 16 is a perspective view for explaining a process for manufacturing the quantum memory according to the first embodiment of the invention.

Then the resist pattern 5 is removed, and an AlGaAs layer 1e is epitaxially grown to fill gaps between the respective quadrangular prisms of InGaAs layers 2, AlGaAs layers 1b, GaAs layers 3, AlGaAs layers 1c, InGaAs layers 4 and AlGaAs layers 1d, as shown in FIG. 16, by MOCVD, for example, under a condition prohibiting epitaxial growth on side walls vertical to the plane of the substrate. The entirety of the AlGaAs layers 1a, 1b, 1c, 1d and 1e corresponds to the AlGaAs layer 1 of FIG. 2.

Thus the quantum memory shown in FIG. 2 is completed.

As described above, according to the quantum memory of the first embodiment, the size of each quantum memory cell is about 10 nm×10 nm, the distance between respective adjacent memory cells is about 50 nm, and the effective area required for each memory cell, i.e. the area per one bit, is only about 50 nm×50 nm=$25 \times 10^{-16}$ m$^2$. Therefore, if the size of the memory cells array 6 mm×6 mm, for example, then the quantum memory can store as much as 16 gigabits of information. Moreover, since the quantum memory uses only one electron-hole pair per bit, its power consumption is remarkably low.

Next, a quantum memory according to a second embodiment of the invention is explained.

The general structure of the quantum memory according to the second embodiment is the same as that of FIG. 1.

Figure 17:
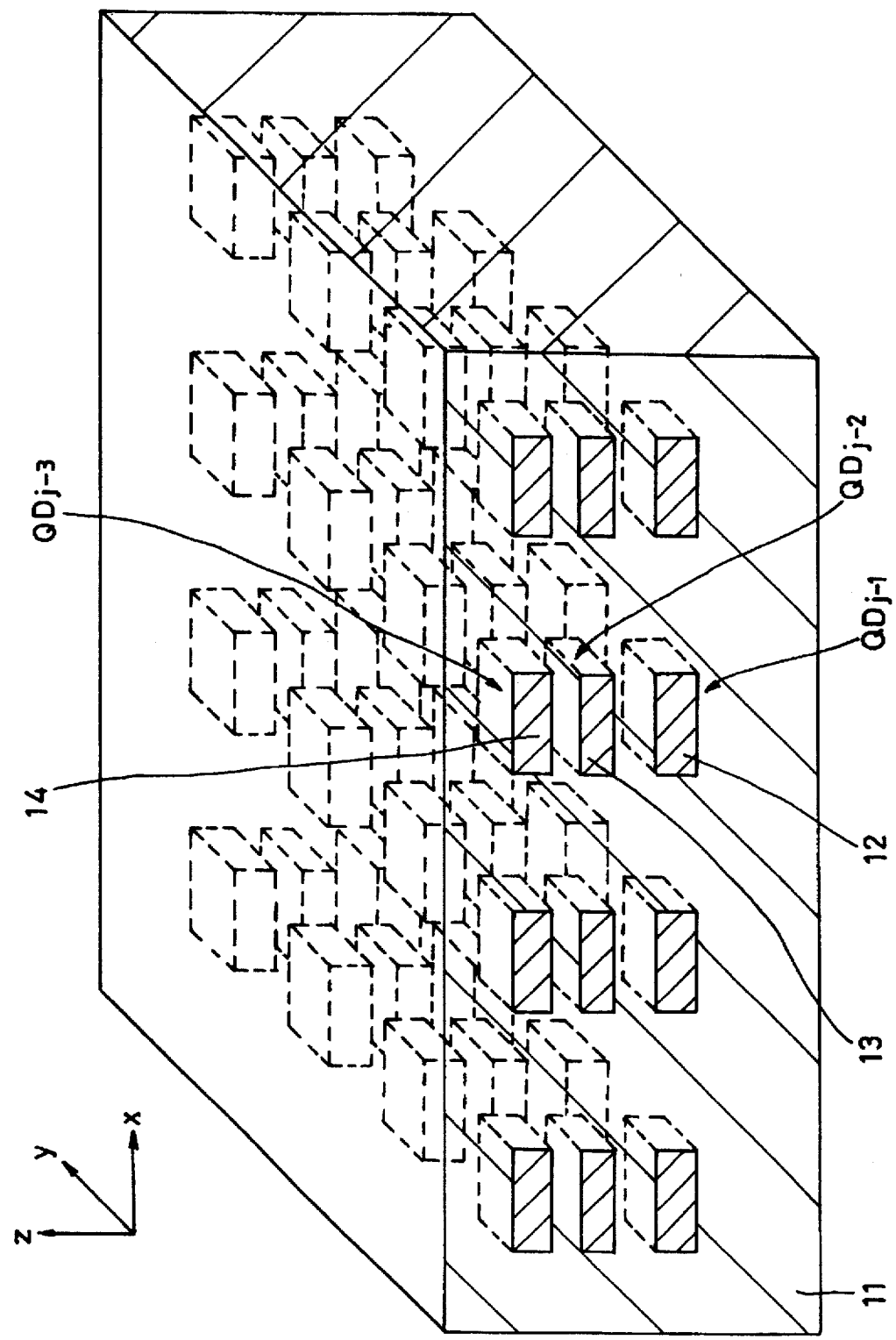
FIG. 17 is a perspective view of a quantum memory according to a second embodiment of the invention.

FIG. 17 is a perspective view of the quantum memory according to the second embodiment, illustrating a part of its memory cell array.

In FIG. 17, reference numeral 11 denotes an AlGaAs layer as a barrier layer. In the AlGaAs layer 1, box-shaped GaAs layers 12 as quantum well layers are arranged in an array of a predetermined pattern on a first plane parallel to the x-y plane, box-shaped GaAs layers 13 as quantum well layers are arranged on a second plane parallel to the x-y plane in an array of the same pattern as that of the underlying GaAs layers 12, and box-shaped InGaAs layers 14 are arranged on a plane parallel to the x-y plane in an array of the same pattern as those of the underlying GaAs layers 13 and 12. These GaAs layers 12, GaAs layers 13 and GaAs layers 14 are embedded in the AlGaAs layer 11 behaving as their barrier layer.

In this case, each quantum dot in the lower stage in FIG. 17, i.e. in the first stage, is formed by the structure where each GaAs layer 12 as a quantum well layer is surrounded by the AlGaAs layer 11 as a barrier layer. Each quantum dot in the middle stage in FIG. 17, i.e. in the second stage, is formed by the structure where each GaAs layer 13 as a quantum well layer is surrounded by the AlGaAs layer 11 as a barrier layer. Each quantum dot in the upper stage in FIG. 17, i.e. in the third stage, is formed by the structure where each GaAs layer 14 as a quantum well layer is surrounded by the AlGaAs layer 11 as a barrier layer. A quantum dot in the first stage, a quantum dot in the second stage and a quantum dot in the third stage, successively aligned in the z direction, make one memory cell. In the following explanation, similarly as the first embodiment, a j-numbered memory cell is identified as memory cell j, its first-stage quantum dot as $QD_{j\text{-}1}$, its second-stage quantum dot as $QD_{j\text{-}2}$, and its third-stage quantum dot as $QD_{j\text{-}3}$, respectively.

That is, in the quantum memory according to the first embodiment, the first-stage quantum dot $QD_{j\text{-}1}$ and third-stage quantum dot $QD_{j\text{-}3}$ of the memory cell j are made of AlGaAs/InGaAs heterojunctions, and the second-stage quantum dot $QD_{j\text{-}2}$ is made of an AlGaAs/GaAs heterojunction; however, in the quantum memory according to the second embodiment, all of the first-stage quantum dot $QD_{j\text{-}1}$, second-stage quantum dot $QD_{j\text{-}2}$ and third-stage quantum dot $QD_3$ are made of the same kind of AlGaAs/GaAs heterojunctions.

Similarly to the first embodiment, the z-directional width of the GaAs layer 12 as the quantum well layer of the quantum dot $QD_{j\text{-}1}$ is expressed as $W_1$, the z-directional width of the GaAs layer 13 as the quantum well layer of the quantum dot $QD_{j\text{-}2}$ is expressed as $W_2$, the z-directional width of the GaAs layer 14 as the quantum well layer of the quantum dot $QD_{j\text{-}3}$ is expressed as $W_3$, the depth of the potential well in the conduction band of the GaAs layer 12 as the quantum well layer of the quantum dot $QD_{j\text{-}1}$ is expressed as $V_1$, the depth of the potential well in the conduction band of the GaAs layer 13 as the quantum well layer of the quantum dot $QD_{j\text{-}2}$ is expressed as $V_2$, and the depth of the potential well in the conduction band of the GaAs layer 14 as the quantum well layer of the quantum dot $QD_{j\text{-}3}$ is expressed as $V_3$. Also, the z-directional width of the AlGaAs 11 as the barrier layer between the GaAs layer 12 as the quantum well layer of the quantum dot $QD_{j\text{-}1}$ and the GaAs layer 13 as the quantum well layer of the quantum dot $QD_{j\text{-}2}$ is expressed as $B_{12}$, and the z-directional width of the AlGaAs layer 11 as the barrier layer between the GaAs layer 13 as the quantum well layer of the quantum dot $QD_{j\text{-}2}$ and the GaAs layer 14 as the quantum well layer of the quantum dot $QD_{j\text{-}3}$ is expressed as $B_{23}$. Further, the ground-state energy level and the first excited-state energy level of an electron in the quantum dot $QD_{j\text{-}k}$ (k=1, 2, 3) are expressed as $E_0^{(j\text{-}k)}$ and $E_1^{(j\text{-}k)}$, respectively, and the ground-state energy level and the first excited-state energy level of a hole in the quantum dot $QD_{j\text{-}k}$ (k=1, 2, 3) are expressed as $H_0^{(j\text{-}k)}$ and $H_1^{(j\text{-}k)}$, respectively.

Then, in the quantum memory according to the second embodiment, quantum dots $QD_{j\text{-}1}$, $QD_{j\text{-}2}$ and $QD_{j\text{-}3}$ constituting the memory cell j are designed to satisfy the following equations:

$$B_{12} > B_{23} \tag{19}$$

$$E_0^{(j\text{-}1)} \sim E_0^{(j\text{-}3)} < E_0^{(j\text{-}2)} \tag{20}$$

The conditions defined by Equation (20) are realized by:

$$W_2 < W_1 \sim W_3 \tag{21}$$

These conditions are simpler than the conditions defined by Equations (9) to (14) for the quantum memory according to the first embodiment. In particular, since the condition of $V_2 < V_1 \sim V_3$ (Equation (10)) is not required, $$V_1 = V_2 = V_3 \tag{22}$$

is also acceptable, and quantum well layers of all quantum dots $QD_{j\text{-}k}$ can be made of the same material, GaAs, as stated above.

Examples of values of $W_1$, $W_2$, $W_3$, $B_{12}$, and $B_{23}$ are $W_1 \sim 10$ nm, $W_2 \sim 5$ nm, $W_3 \sim 10$ nm, $B_{12} \sim (10\text{-}15)$nm, and $B_{23} \sim 5$ nm. The size of each quantum dot $QD_{j\text{-}k}$ (k=1, 2, 3) on a plane parallel to the x-y plane is ~10 nm, for example, and the distance between respective adjacent quantum dots is ~50 nm, for example.

Figure 18:
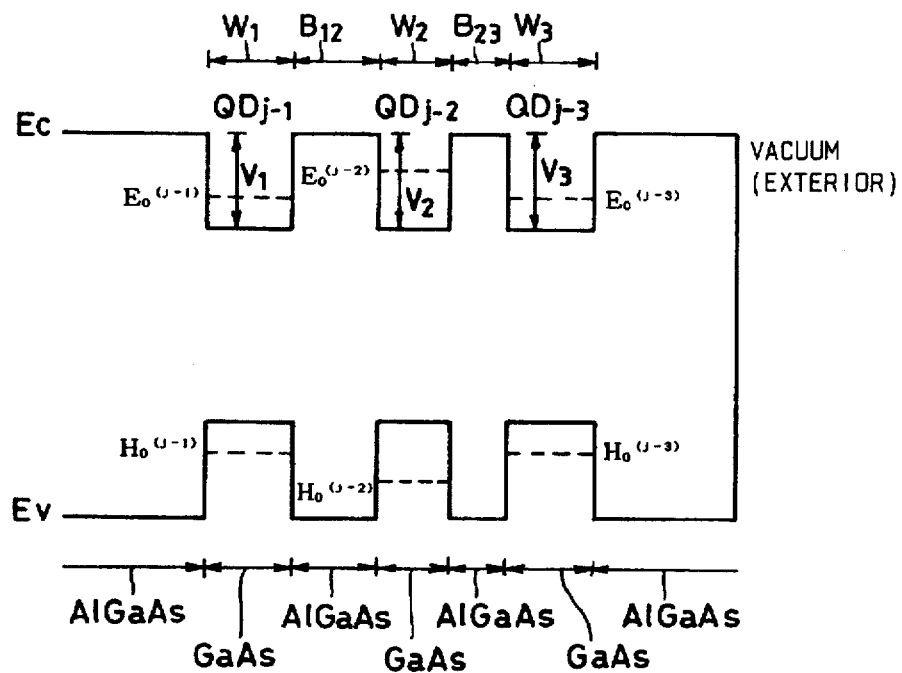
FIG. 18 is an energy band diagram of the quantum memory according to the second embodiment of the invention.

FIG. 18 shows an energy band diagram of the memory cell j taken along the stacking direction of the quantum dot $QD_{j\text{-}k}$.

Explained below is the principle of operation of the quantum memory having the above-described structure according to the second embodiment.

Figure 19:
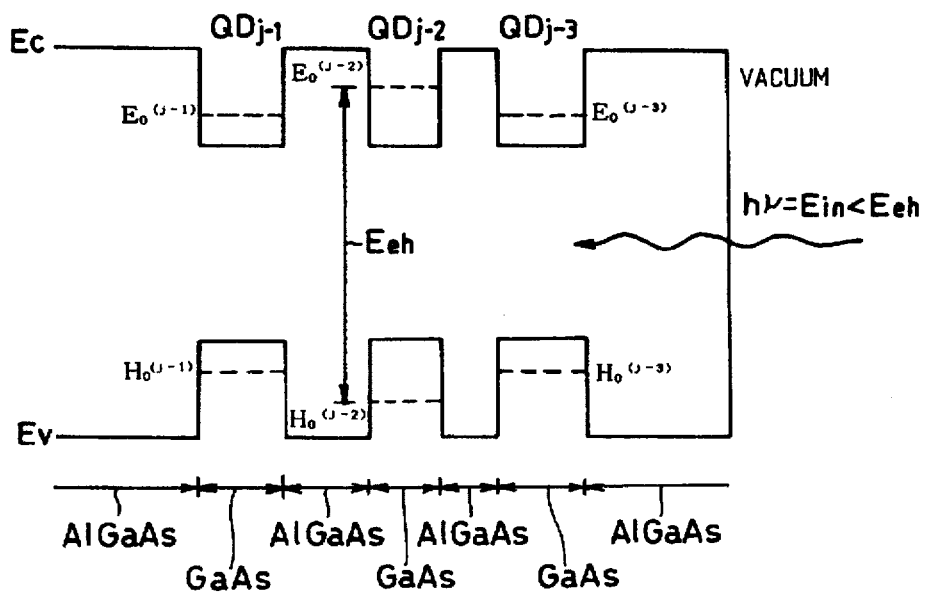
FIG. 19 is an energy band diagram for explaining a method of writing into the quantum memory according to the second embodiment of the invention.

For writing of the quantum memory according to the second embodiment, laser beam L is held irradiated to an area including a memory cell chosen for writing in the same manner as shown in FIG. 4. In this state, no external electric field is applied to any of the memory cells. The laser beam L used has a smaller photon energy (longer wavelength) than the electron-hole pair generation energy, $E_{eh}$, in the second-stage quantum dot $QD_{j\text{-}2}$ with no external electric field applied through the needle electrode NE. That is, if the photon energy of the laser beam L is $h\nu = E_{in}$, then $E_{in} < E_{eh}$. In this state, no electron-hole pair is generated in the quantum dot $QD_{j\text{-}2}$ by irradiation of the laser beam L, and light absorption does not occur (FIG. 19).

Figure 20:
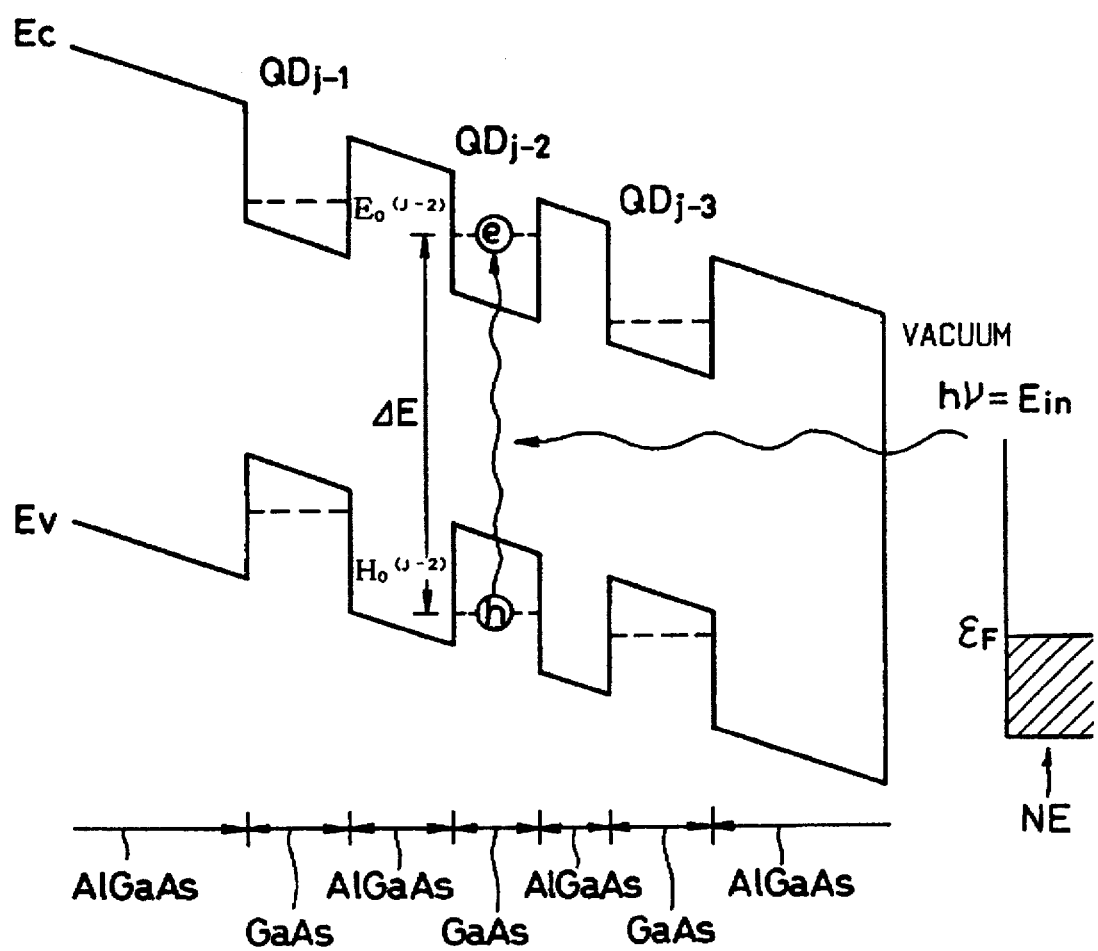
FIG. 20 is an energy band diagram for explaining a method of writing into the quantum memory according to the second embodiment of the invention.

In the state where the laser beam L irradiates to the area including the memory cell j chosen for writing as stated above, an external electric field is applied by bringing close to the memory cell j the needle electrode NE applied with a positive voltage relative to the quantum memory, in the same manner as shown in FIG. 6. The resulting energy band diagram of the memory cell j is shown in FIG. 20. When such an external electric field is applied, $$\Delta E = E_0^{(j\text{-}2)} - H_0^{(j\text{-}2)} \tag{23}$$

decreases by the Stark shift. If the magnitude of the external electric field satisfies $\Delta E = E_{in}$, resonant absorption of the laser beam L occurs, and an electron-hole pair is produced in the quantum dot $QD_{j-2}$ (FIG. 20). The Stark shift is advantageously large due to the existence of the upper and lower quantum dots $QD_{j-1}$ and $Q_{j-3}$ in comparison with a case of a single quantum dot $QD_{j-2}$.

Figure 21:
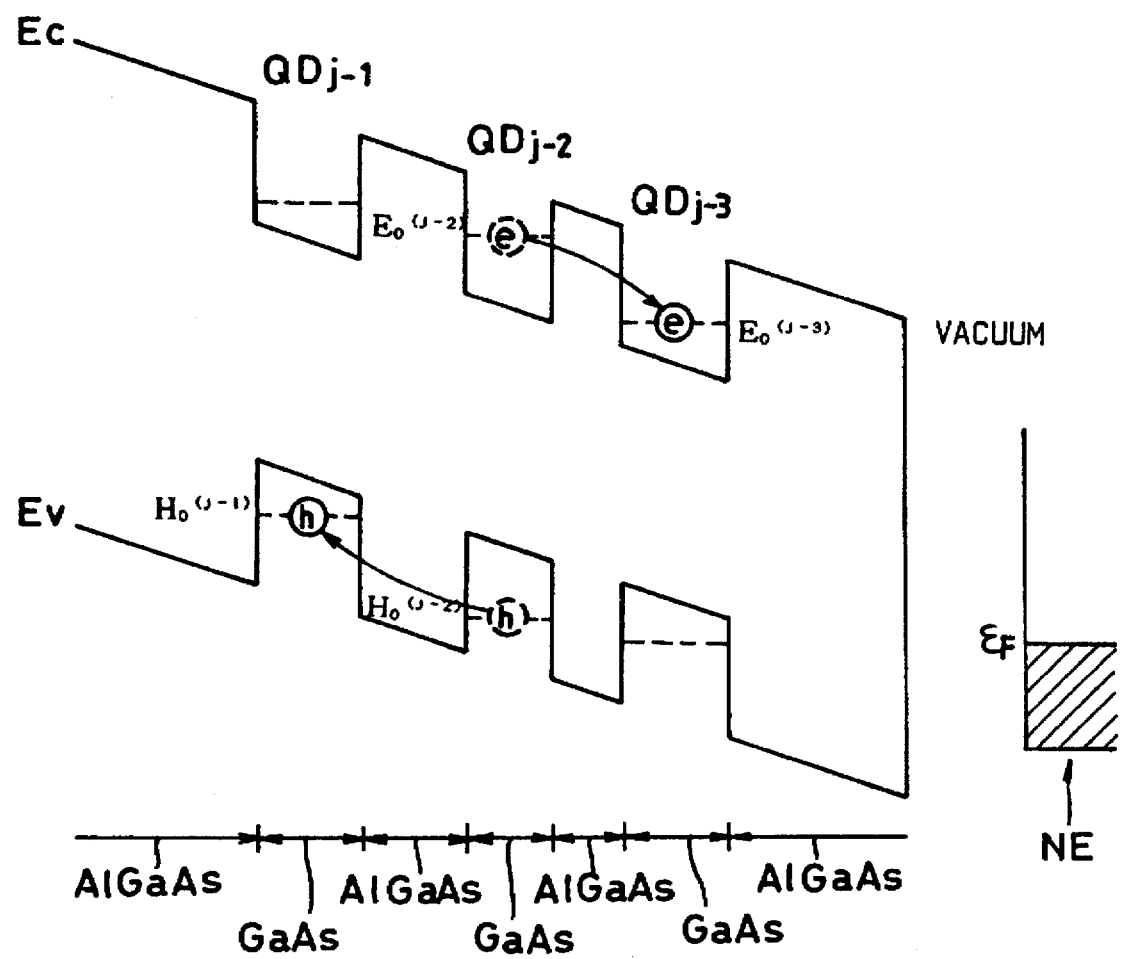
FIG. 21 is an energy band diagram for explaining a method of writing into the quantum memory according to the second embodiment of the invention.

As shown in FIG. 21, due to the external electric field applied in the z direction, the electron of the electron-hole pair generated in the quantum dot $QD_{j-2}$ quickly moves into the quantum dot $QD_{j-3}$, and the hole to the quantum dot $QD_{j-1}$. Then the electron having moved into the quantum dot $QD_{j-3}$ relaxes to the ground-state energy level $E_0^{(j-3)}$ with a lower energy, the hole having moved into the quantum dot $QD_{j-1}$ relaxes to the ground-state energy level $H_0^{(j-1)}$ with a lower energy, and they are spatially isolated from each other.

Figure 22:
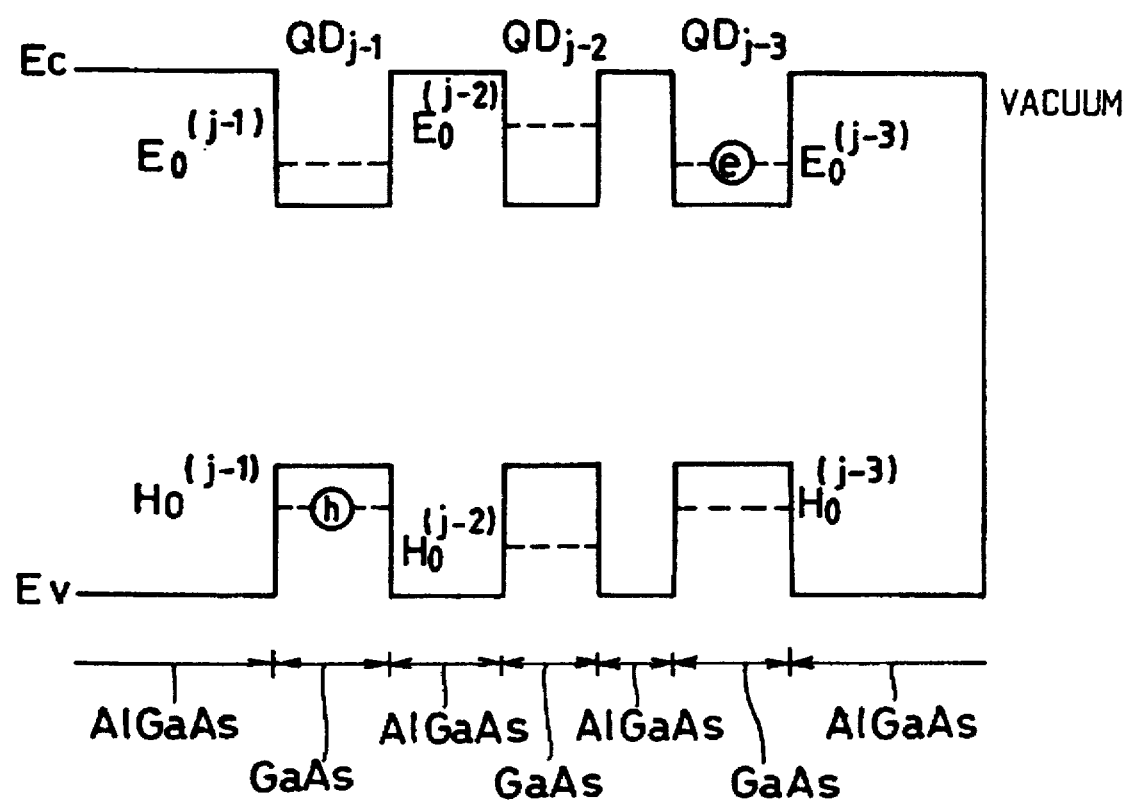
FIG. 22 is an energy band diagram after writing into the quantum memory according to the second embodiment of the invention.

After that, the external electric field is removed by withdrawing the needle electrode NE from the memory cell j. Since the electron and the hole in the memory cell j are spatially distant from each other, they remain stable without being recombined (FIG. 22). Similarly to the first embodiment, the state established by the entry of the electron into the quantum dot $QD_{j-3}$ and the entry of the hole into the quantum dot $QD_{j-1}$, as shown in FIG. 22, exhibits that one bit has been stored.

Since the external electric field applied through the needle electrode NE is weak in the other memory cells also exposed to the laser beam L, the Stark shift is not large enough to cause light absorption, and no electron-hole pair is generated in these other memory cells. That is, the electron-hole pair is generated only in the memory cell j, and one bit information is stored there.

Explained below is a process of reading from the quantum memory according to the first embodiment.

When the ground state of an electron and its energy are expressed as $|\psi_0^{(j-k)}\rangle$ and $\epsilon_0^{(j-k)}$ (k=2,3) when the second-stage quantum dot $QD_{j-2}$ and the third-stage quantum dot $QD_{j-3}$ of the memory cell j exist independently, respectively, there is established $$\epsilon_0^{(j-2)} > \epsilon_0^{(j-3)} \tag{24}$$

Figure 23:
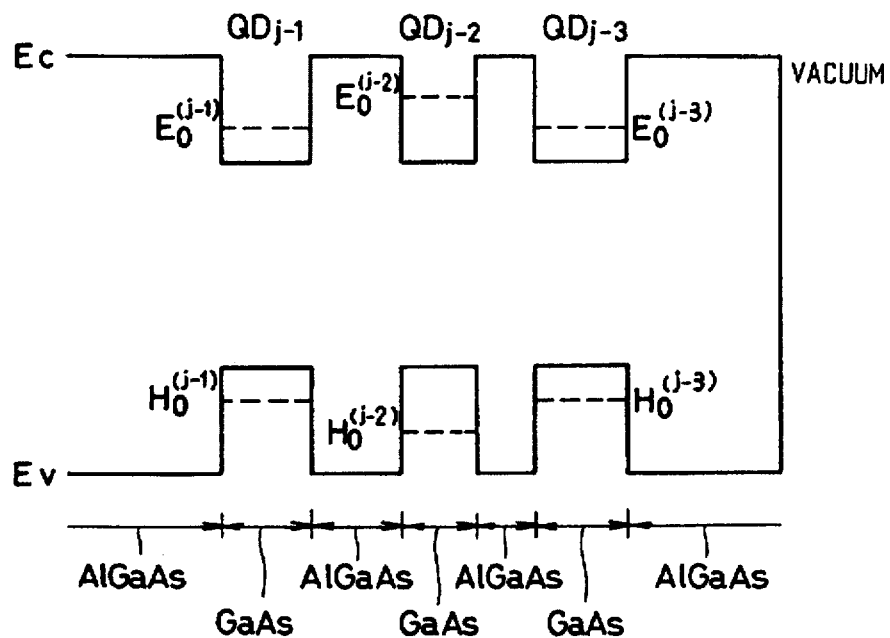
FIG. 23 is an energy band diagram of the quantum memory according to the second embodiment of the invention.
Figure 24:
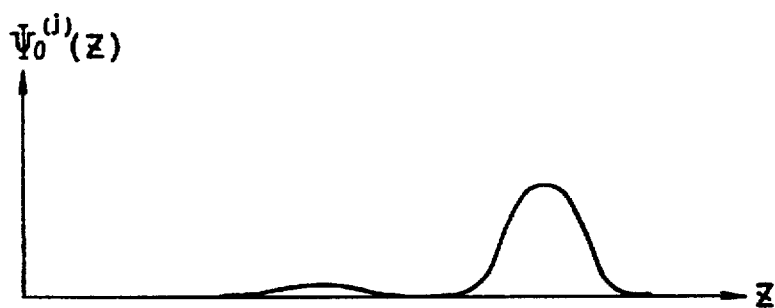
FIG. 24 is a schematic diagram, in a relation with FIG. 23, illustrating the wave function in the ground state in a coupled quantum dots system forming a memory cell of the quantum memory according to the second embodiment of the invention.
Figure 25:
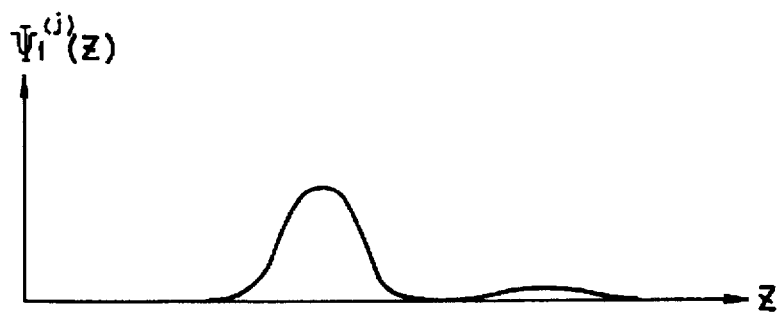
FIG. 25 is a schematic diagram, in a relation with FIG. 23, illustrating the wave function in a first excited-state in a coupled quantum dots system forming a memory cell of the quantum memory according to the second embodiment of the invention.

In the quantum memory according to the second embodiment, two quantum dots $QD_{j-2}$ and QD are coupled to each other, and the barrier width $B_{23}$ between them is small. However, since their energies $\epsilon_0^{(j-2)}$ and $\epsilon_0^{(j-3)}$ are different, the states $|\psi_0^{(j-2)}\rangle$ and $|\psi_0^{(j-3)}\rangle$ do not merge so much. Therefore, the ground state $|\psi_0^{(j)}\rangle$ and the first excited state $|\psi_1^{(j)}\rangle$ are:

$$|\psi_0^{(j)}\rangle \sim |\psi_0^{(j-3)}\rangle \tag{25}$$

$$|\psi_1^{(j)}\rangle \sim |\psi_0^{(j-2)}\rangle \tag{26}$$

wave functions of the ground state $|\psi_0^{(j)}\rangle$ and the first excited state $|\psi_1^{(j)}\rangle$ are as shown in FIGS. 24 and 25, respectively, in relation with FIG. 23 similar to FIG. 18. Since these states $|\psi_0^{(j)}\rangle \sim |\psi_0^{(j-3)}\rangle$ are spatially separated as shown in FIGS. 24 and 25, the probability of absorbing incident light, if any, is very small.

Figure 26:
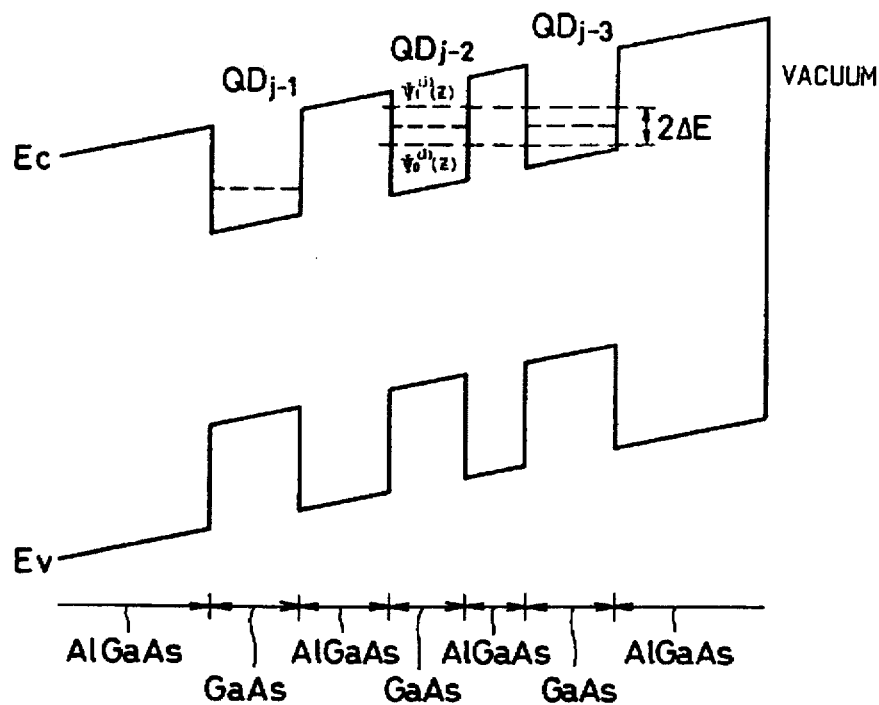
FIG. 26 is an energy band diagram for explaining a method of reading from the quantum memory according to the second embodiment of the invention.
Figure 27:
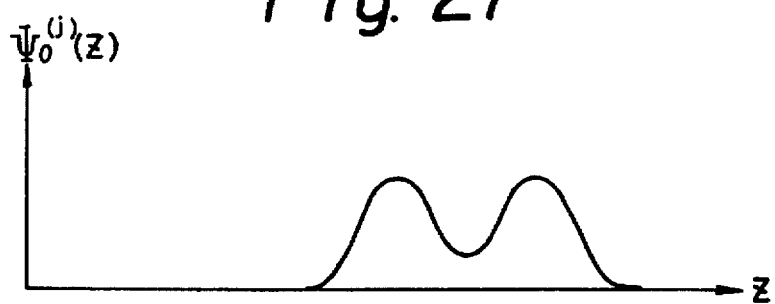
FIG. 27 is a schematic diagram, in a relation with FIG. 26, illustrating the wave function of the bonding state in a coupled quantum dots system forming a memory cell of the quantum memory according to the second embodiment of the invention.
Figure 28:
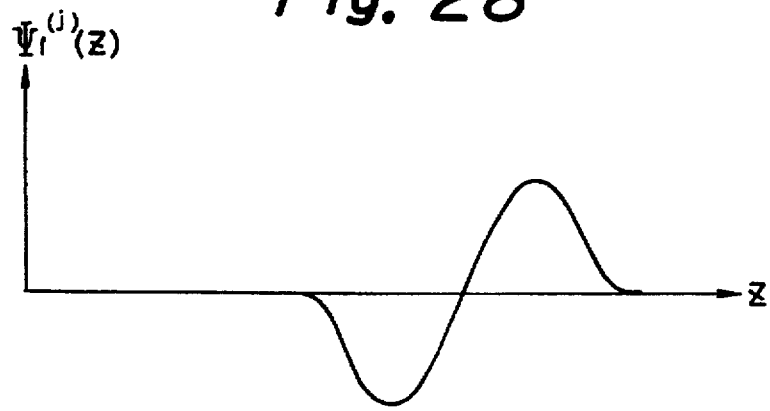
FIG. 28 is a schematic diagram, in a relation with FIG. 26, illustrating the wave function in the antibonding state in a coupled quantum dots system forming a memory cell of the quantum memory according to the second embodiment of the invention.

When an external electric field is applied to the coupled quantum dots system, the energy band diagram of the memory cell j becomes as shown in FIG. 26. By application of the external electric field, the quantum states vary. As the energy levels of the quantum dots $QD_{j-2}$ and $QD_{j-3}$, when each existing independently, approach each other, both states resonantly merge. The resulting quantum states of the coupled quantum dots system are:

$$|\psi_0^{(j)}\rangle \sim (|\psi_0^{(j-2)}\rangle + |\psi_0^{(j-3)}\rangle) \tag{27}$$

$$|\psi_1^{(j)}\rangle \sim (|\psi_0^{(j-2)}\rangle - |\psi_0^{(j-3)}\rangle) \tag{28}$$

and are split into the bonding state $|\psi_0^{(j)}\rangle$ and the antibonding state $|\psi_1^{(j)}\rangle$. The split width of energies is expressed as $2\Delta E$. Wave functions of these bonding state $|\psi_0^{(j)}\rangle$ and antibonding state $|\psi_1^{(j)}\rangle$ in relation with FIG. 26 become as shown in FIGS. 27 and 28. As apparent from FIGS. 27 and 28, these two states spatially widely overlap each other, and the probability of absorption of incident light is great.

Therefore, when an external electric field is applied only to a particular memory cell by using, for example, a needle electrode similar to a scanning needle used in a scanning tunnel microscope, light absorption of energy $2\Delta E$ occurs only when an electron exists in the memory cell, and no light absorption can occur otherwise.

Figure 29:
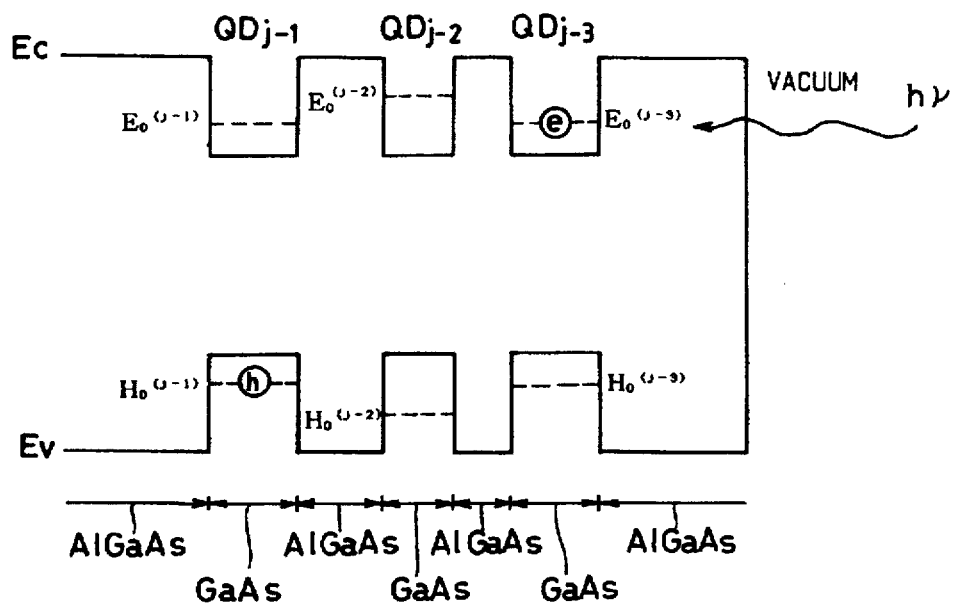
FIG. 29 is an energy band diagram for explaining a method of reading from the quantum memory according to the second embodiment of the invention.
Figure 30:
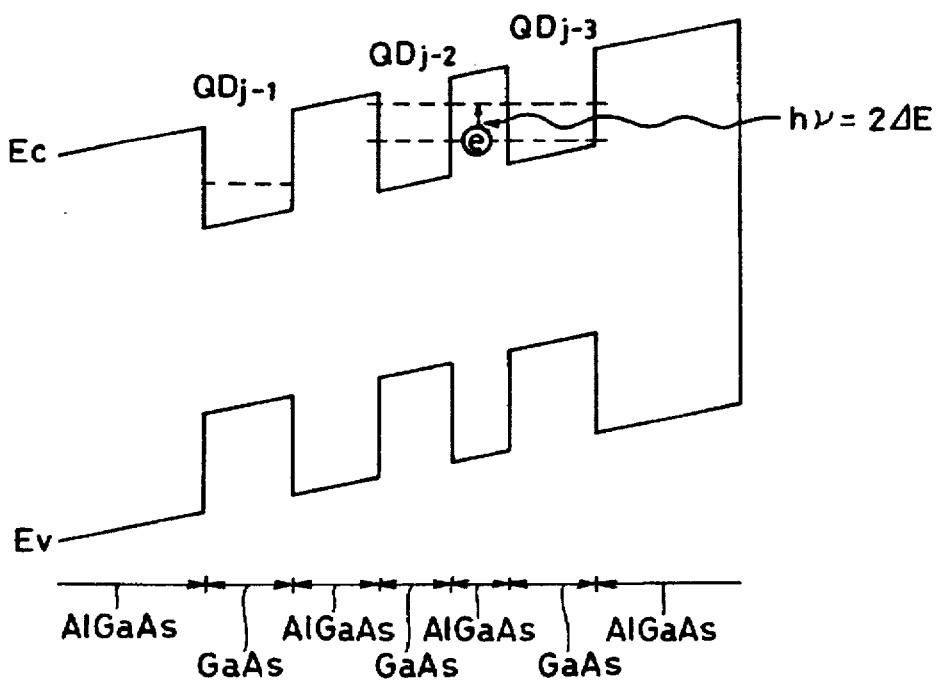
FIG. 30 is an energy band diagram for explaining a method of reading from the quantum memory according to the second embodiment of the invention.

Explained below is a process of reading one bit of information stored in a memory cell by utilizing the principle discussed above. In the same manner as shown in FIG. 4, the laser beam L having the photon energy $2\Delta E = h\nu$ is held irradiated to an area including the memory cell j chosen for reading. As discussed above, when no external electric field is applied to the memory cell j (FIG. 29), light absorption cannot occur. Next, in the same manner as shown in FIG. 6, the needle electrode NE applied with a negative voltage relative to the quantum memory is brought close to the memory cell j. The resulting energy band diagram of the memory cell j is as shown in FIG. 30. If the quantum dot $QD_{j-3}$ of the memory cell j contains an electron, resonant absorption of the laser light L occurs. If no electron exists in the memory cell j, light absorption does not occur. Therefore, information of the memory cell j can be read out by the presence or absence of light absorption.

If an electron exists in the quantum dot $QD_{j-3}$ of the memory cell j, a hole also exists in its quantum dot $QD_{j-1}$. Since the width of the barrier layer, $B_{12}$, between the quantum dot $QD_{j-1}$ and the quantum dot $QD_{j-2}$ is different from the width of the barrier layer, $B_{23}$, between the quantum dot $QD_{j-2}$ and the quantum dot $QD_{j-3}$ as $$B_{12} > B_{23} \tag{29}$$

the hole in the quantum dot $QD_{j-1}$ is not resonant with the state of the quantum dot $QD_{j-2}$, and since the width of the tunnelling barrier, $B_{12}$, is large, the coupling force between the quantum dot $QD_{j-1}$ and the quantum dot $QD_{j-2}$ is also small. Therefore, the hole in the quantum dot $QD_{j-1}$ does not move to the quantum dot $QD_{j-2}$ but remains in the quantum dot $QD_{j-1}$. For the same reason, the electron in the quantum dot $QD_{j-3}$ does not move to the quantum dot $QD_{j-1}$. The reason why coupling of electron states through the $B_{23}$ thick barrier is overwhelmingly stronger than coupling of hole states relies not only on the difference between $B_{12}$ and $B_{23}$ but also on the hole having a larger effective mass than that of the electron.

It is recognized that, similarly to the writing process, the external electric field applied through the needle electrode NE is weak in memory cells other than the memory cell j, also exposed to the laser beam L; the electron in the memory cell, if any, cannot move to the second-stage quantum dot; no light absorption occurs; and only the information from the memory cell j can be read out selectively.

Explained below is a method of initializing (or erasing) the quantum memory according to the first embodiment. There are two methods of initializing a particular memory cell. One of them is to cause electron-hole recombination in the memory cell j to be initialized, by applying an external electric field to the memory cell j through the needle electrode NE applied with a negative voltage larger than that for reading and brought close to the memory cell j. The other method is to induce electron-hole recombination in the memory cell j by applying an external electric field as large as that for reading, for example, for a longer time.

Figure 31:
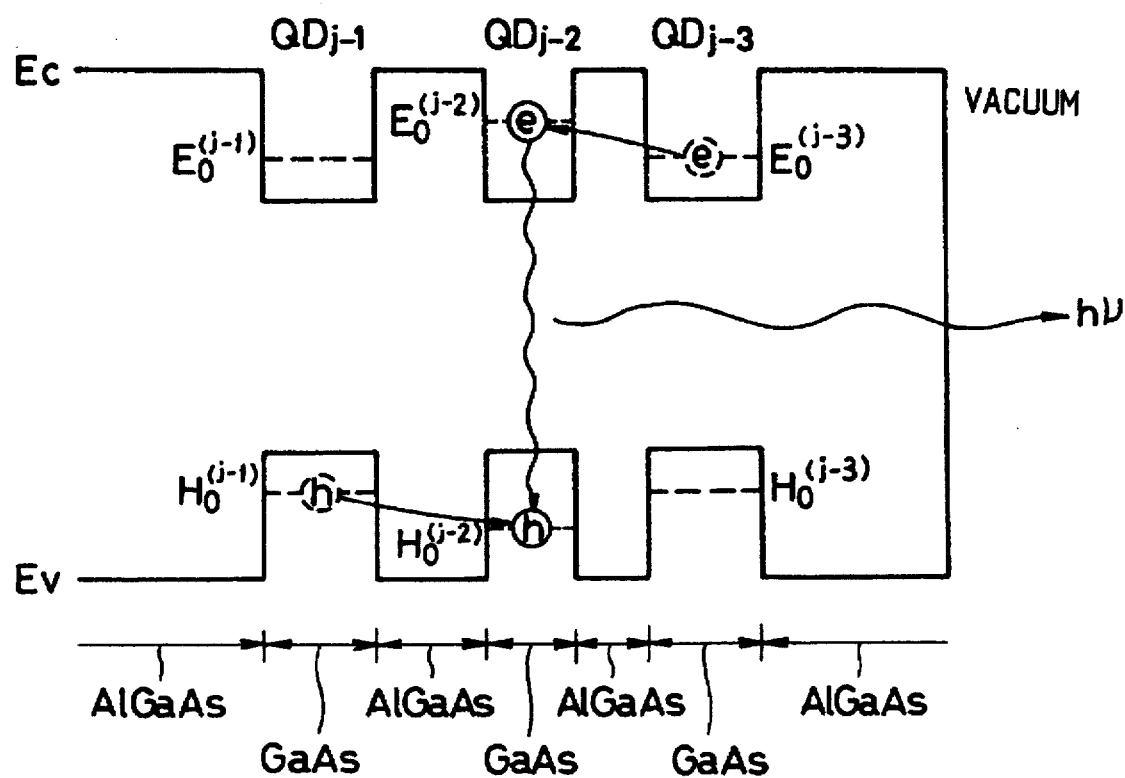
FIG. 31 is an energy band diagram for explaining a method of initializing the quantum memory according to the second embodiment of the invention.

For initializing all memory cells simultaneously, there is a method of increasing the temperature of the quantum memory to promote electron-hole recombination by absorption of phonons. An appropriate temperature T of the quantum memory for this purpose is high enough to thermally excite a hole in the ground-state energy level $H_0^{(j-1)}$ of a hole in the quantum dot $QD_{j-1}$ to the ground-state energy level $H_0^{(j-2)}$ of a hole in the quantum dot $QD_{j-2}$, and an electron in the ground-state energy level $E_0^{(j-3)}$ of an electron in the quantum dot $QD_{j-3}$ to the ground-state energy level $E_0^{(j-2)}$ of an electron in the quantum dot $QD_{j-2}$, respectively, as shown in FIG. 31. More specifically, it is in the range satisfying $$(H_0^{(j-2)}-H_0^{(j-1)})-(E_0^{(j-2)}-E_0^{(j-3)})-k_BT \tag{30}$$

Another method of initializing all memory cells simultaneously is to irradiate monochromatic light with a photon energy defined by Equation (30) to the entirety of the quantum memory, thus exciting electrons in third-stage quantum dots and holes in first-stage quantum dots in all memory cells into second-stage quantum dots, and causing electron-hole recombination.

Explained below is a method for manufacturing the quantum memory having the above-described structure according to the second embodiment.

Figure 32:
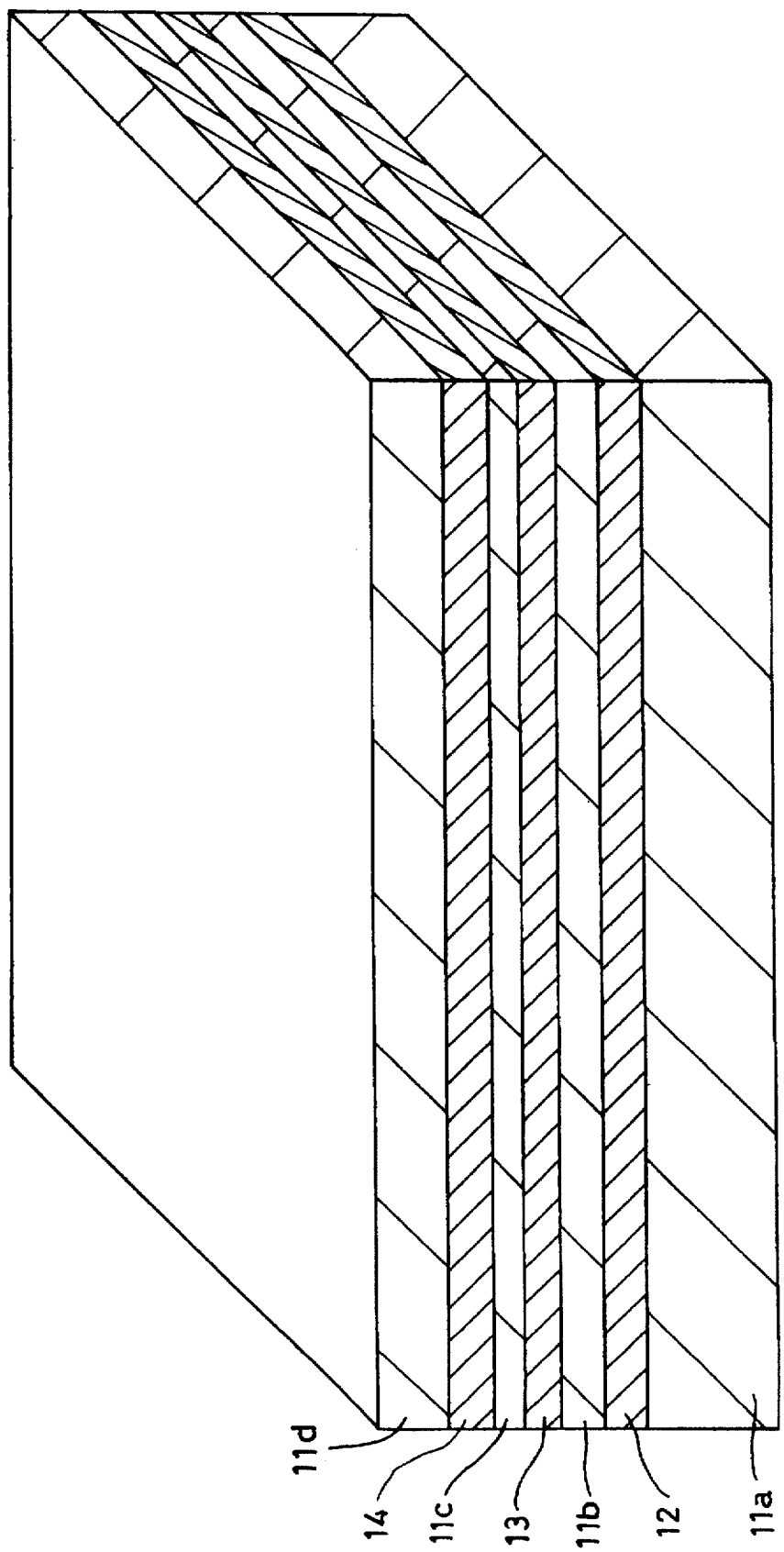
FIG. 32 is a perspective view for explaining a process for manufacturing the quantum memory according to the second embodiment of the invention.

As shown in FIG. 32, epitaxial layers grown on a compound semiconductor substrate such as GaAs substrate (not shown) are, in sequence, a sufficiently thick AlGaAs layer 11a, GaAs layer 12 having the thickness $W_1$, AlGaAs layer 11b having the thickness $B_{12}$, GaAs layer 13 having the thickness $W_2$, AlGaAs layer 11c having the thickness $B_{23}$, GaAs layer 14 having the thickness $W_3$, and AlGaAs layer 11d of a predetermined thickness, by MOCVD or MBE, for example.

Figure 33:
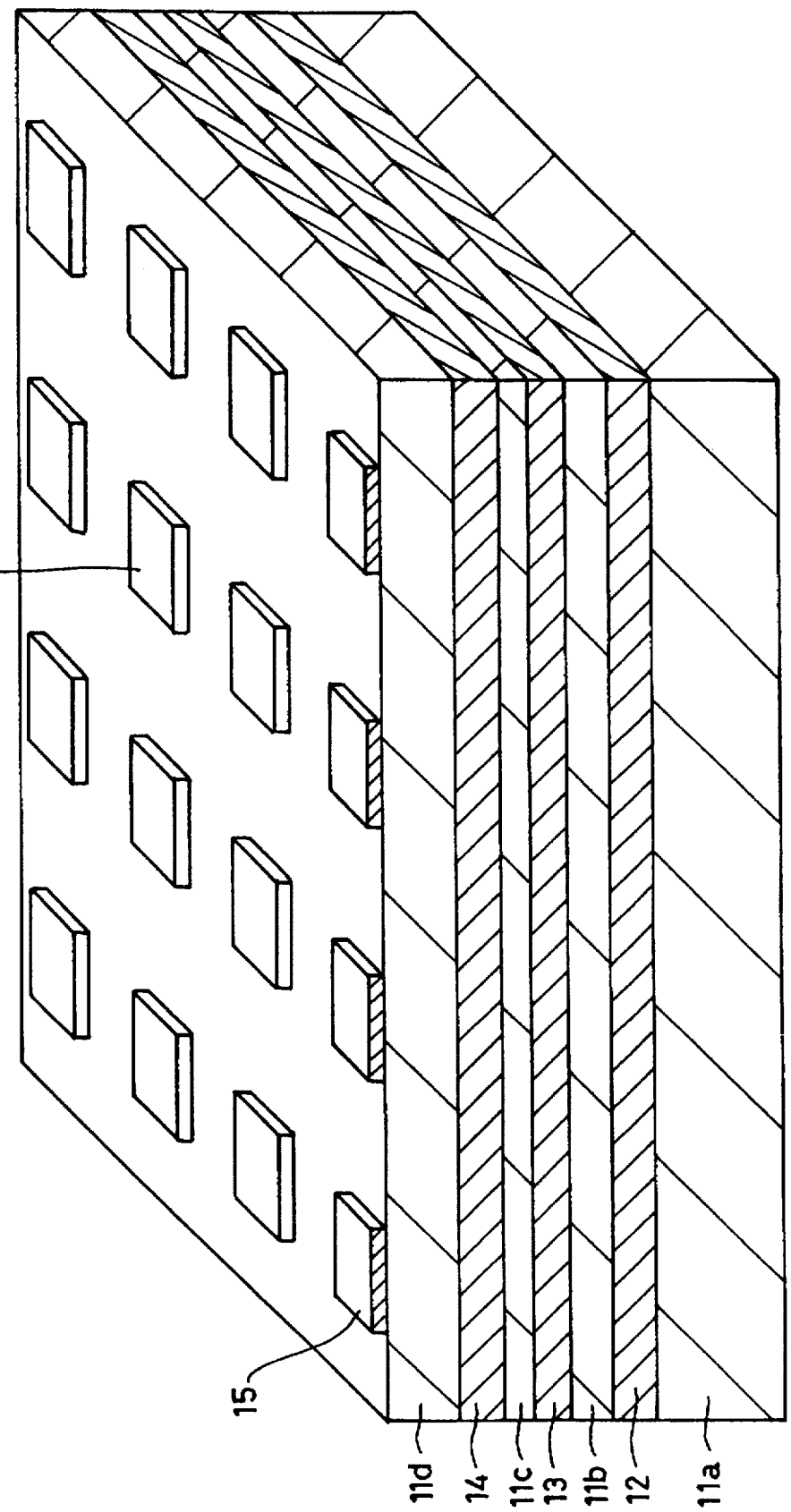
FIG. 33 is a perspective view for explaining a process for manufacturing the quantum memory according to the second embodiment of the invention.

Next, as shown in FIG. 33, a resist pattern 15 with a shape corresponding to memory cells is formed on the AlGaAs layer 11d by electron beam lithography, for example.

Figure 34:
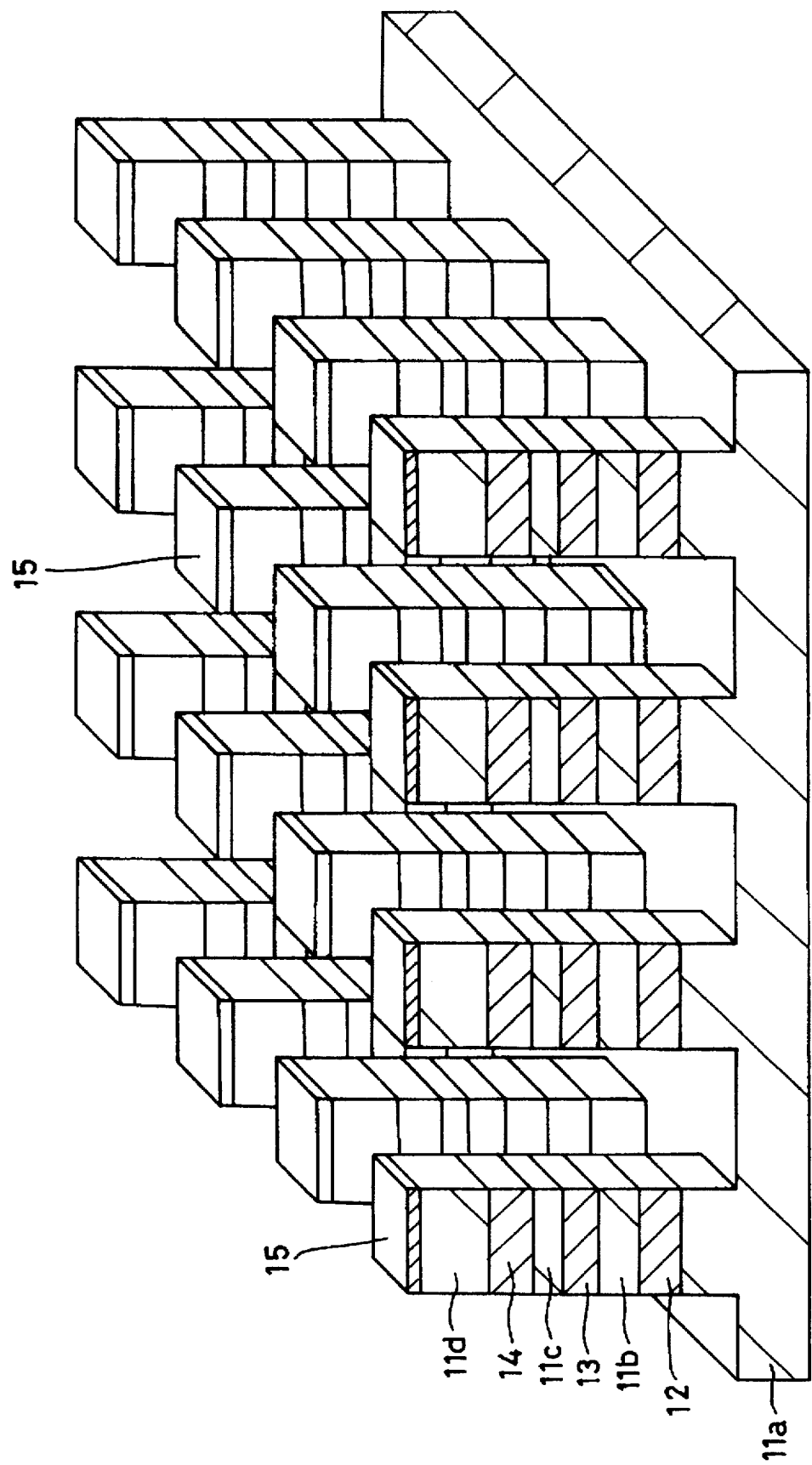
FIG. 34 is a perspective view for explaining a process for manufacturing the quantum memory according to the second embodiment of the invention.

By using the resist pattern 15 as a mask, the AlGaAs layer 11d, GaAs layer 14, AlGaAs layer 11c, GaAs layer 13, AlGaAs layer 11b and GaAs layer 12 are selectively etched off in sequence in the vertical direction relative to the plane of the substrate by RIE, for example. This etching is done to a slightly over-etching extent so as to separate the GaAs layers 12 from each other. As a result, as shown in FIG. 34, the GaAs layer 2, AlGaAs layer 11b, GaAs layer 13, AlGaAs layer 11c, GaAs layer 14 and AlGaAs layer 11d are patterned into quadrangular prisms.

Figure 35:
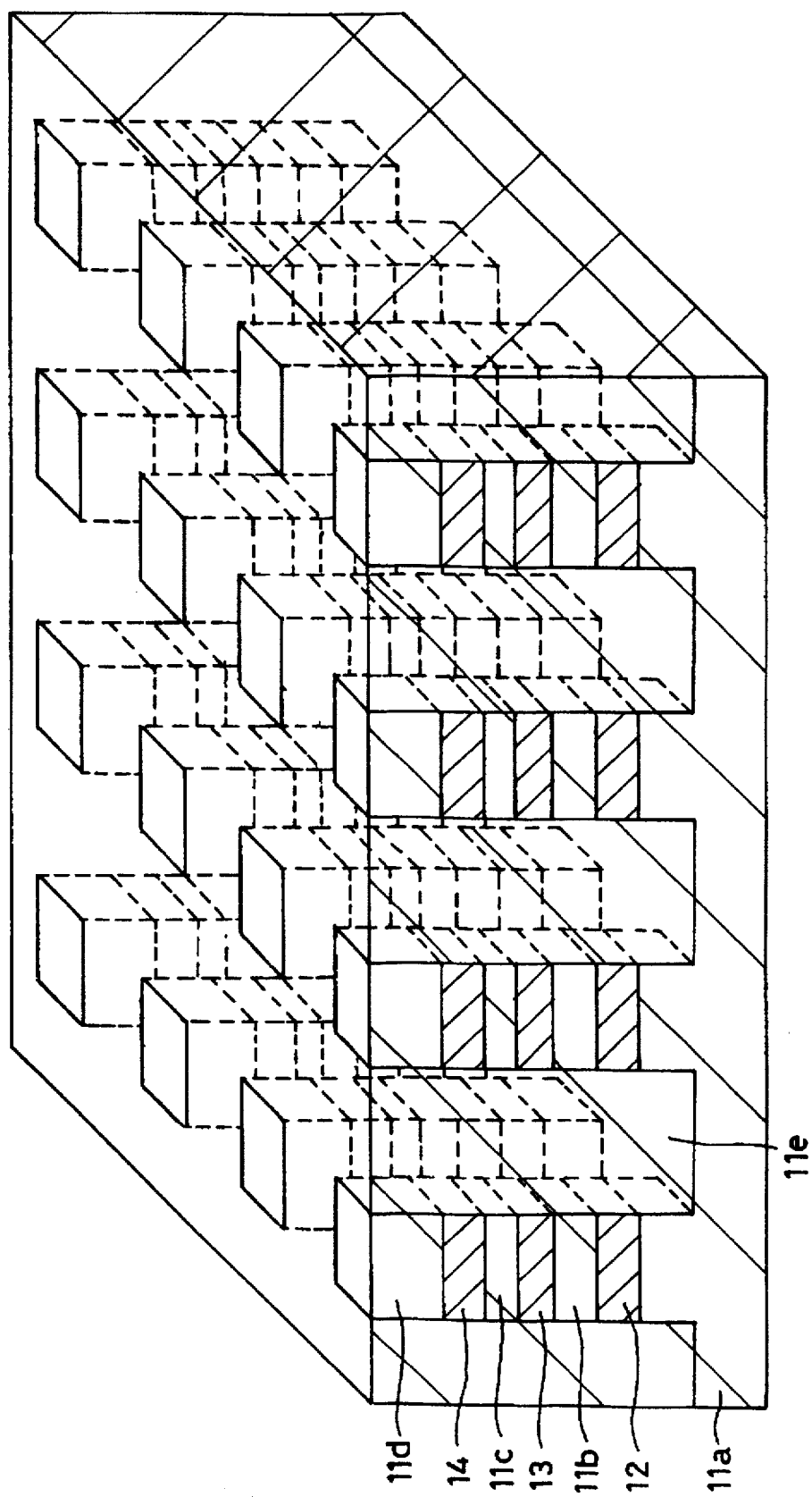
FIG. 35 is a perspective view for explaining a process for manufacturing the quantum memory according to the second embodiment of the invention.

Then the resist pattern 15 is removed, and an AlGaAs layer 11e is epitaxially grown to fill gaps between the respective quadrangular prisms of GaAs layers 12, AlGaAs layers 11b, GaAs layers 13, GaAs layers 11c, GaAs layers 14 and AlGaAs layers 11d, as shown in FIG. 35, by MOCVD or MBE, for example, under a condition prohibiting epitaxial growth on side walls vertical to the plane of the substrate. The entirety of the AlGaAs layers 11a, 11b, 11c, 11d and 11e corresponds to the AlGaAs layer 11 of FIG. 17.

Thus the quantum memory shown in FIG. 17 is completed.

As described above, according to the quantum memory according to the second embodiment, the size of each quantum memory cell is about 10 nm×10 nm, the distance between respective adjacent memory cells is about 50 nm, and the area required for one bit is only about 50 nm×50 nm=25×10$^{-16}$ m$^2$. Therefore, if the size of the memory cells array is 6 mm×6 mm, for example, then the quantum memory can store as much as 16 gigabits of information. Moreover, since the quantum memory uses only one electron-hole pair per bit, its power consumption is remarkably low.

In addition to these advantages common to those of the first embodiment, the second embodiment has another advantage that the quantum memory can be made of only one kind of AlGaAs/GaAs heterojunctions, which simplifies the structure and the manufacturing process.

Figure 36:
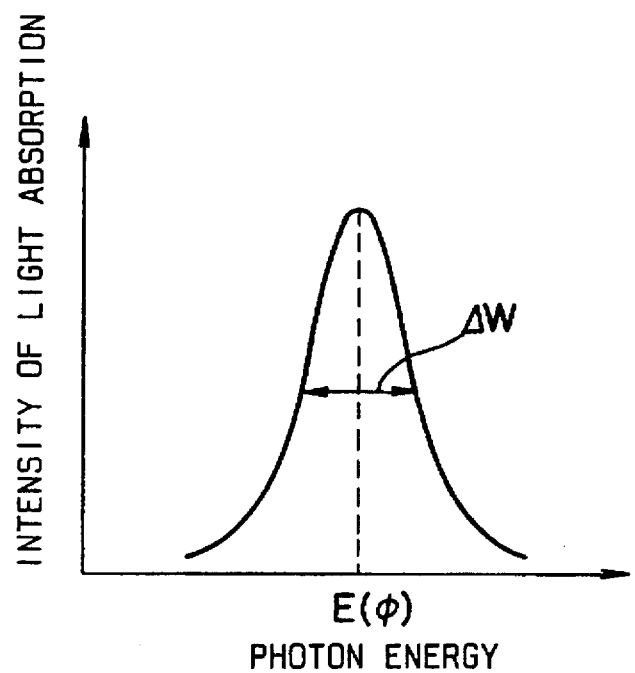
FIG. 36 is a schematic diagram showing a curve of the strength of light absorption with an external electric field applied by irradiating a laser beam to a surface of a quantum memory through a needle electrode.

For writing or reading of the quantum memory, either of the first embodiment or the second embodiment, an external electric field is applied to a particular memory cell for writing or reading through the needle electrode NE while irradiating laser light L with a predetermined photon energy to an area including the particular memory cell. The external electric field changes internal quantum states of quantum dots in the memory cell to enable them to resonantly absorb the laser light L, and thus enables writing or reading. In the curve of FIG. 36 showing an intensity of light absorption, light energy causing the resonant absorption is named $E(\phi)$ as a function of the surface potential $\phi$ of the quantum memory with the external electric field applied, and width at half maximum of the curve of intensity of light absorption is labeled $\Delta W$.

Figure 38:
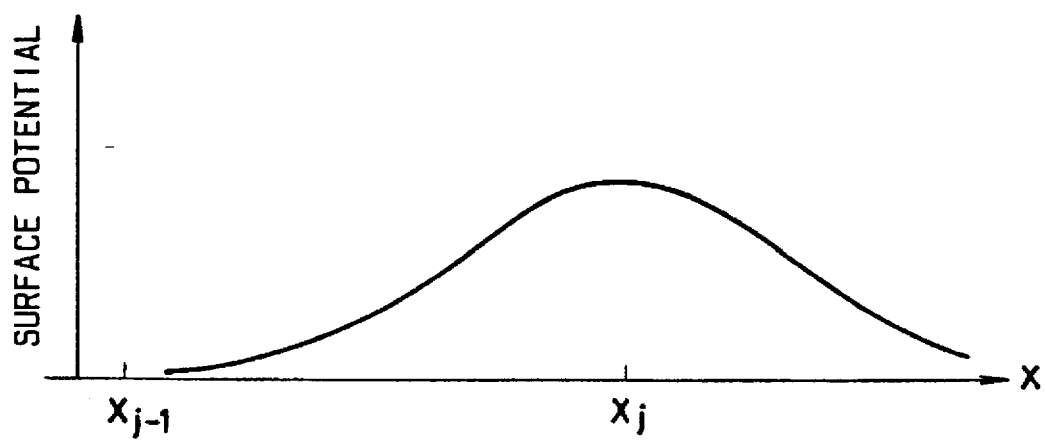
FIG. 38 is a schematic diagram showing a spatial distribution of the surface potential of a quantum memory.
Figure 37:
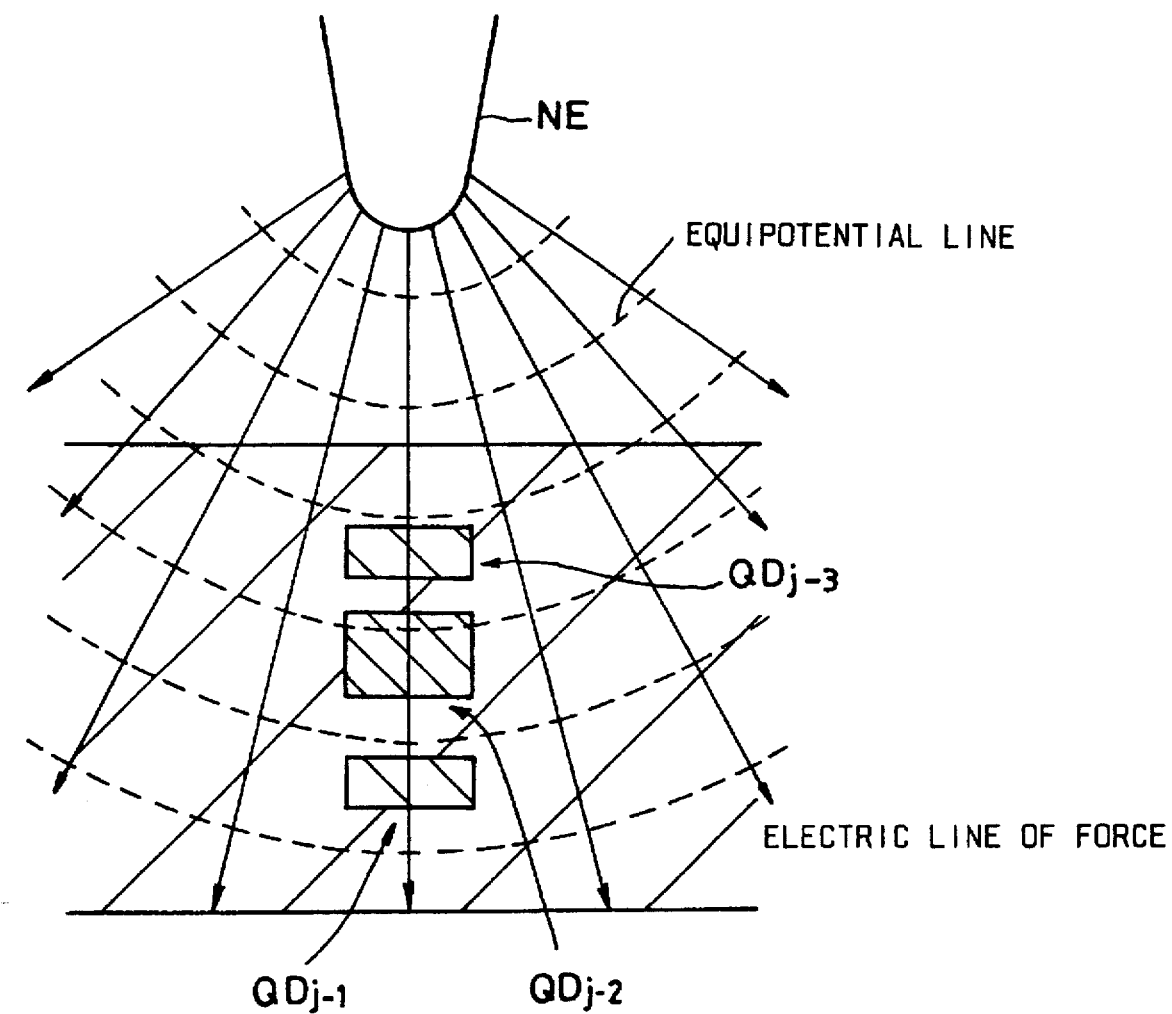
FIG. 37 is a schematic diagram showing a potential distribution with an external electric field applied to a surface of a quantum memory by bringing a needle electrode close to a surface of a quantum memory.

Spatial potential distribution is as shown in FIG. 37 when an external electric field is applied by the needle electrode NE similar to a scanning needle of an ordinary scanning tunnel microscope. In this case, the exterior of the needle electrode NE made of a metal, or the like, is vacuum, and its dielectric constant is small. As a result, the external electric field applied to the quantum memory by the needle electrode NE extends considerably. In this condition, the potential distribution $\phi(x)$ on the surface of the quantum memory exhibits a moderate curve as shown in FIG. 38. Therefore, in order to cause resonant absorption only the memory cell j just under the needle electrode NE and not in its adjacent memory cells, a sufficiently large distance is required between respective adjacent memory cells. That is, the memory cell j is not distinctive from adjacent memory cells j-1 unless satisfying:

$$E(\phi(x_{j-1}))<E(\phi(x_j))-\Delta W \tag{31}$$

or $$E(\phi(x_j))+\Delta W<E(\phi(x_{j-1})) \tag{32}$$

where $x_j$ is the positional coordinates of the memory cell j, and $x_{j-1}$ is those of an adjacent memory cell j-1.

The need for a sufficiently large distance between respective adjacent memory cells is not preferable for improving the rate of integration of quantum memory. This problem, however, can be solved by spatially localizing the external electric field applied by the needle electrode NE. Explained below is a needle electrode NE enabling spatial localization of the external electric field.

Figure 39:
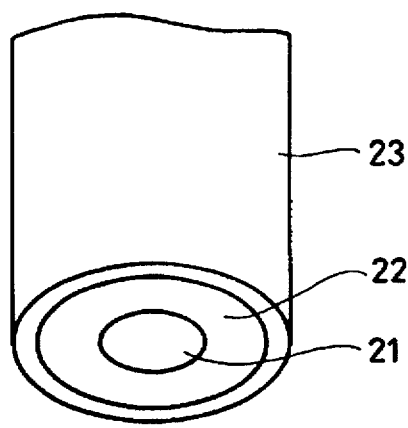
FIG. 39 is a perspective view of a preferable structure of a needle electrode.

FIG. 39 shows such a needle electrode NE. As shown in FIG. 39, the needle electrode NE comprises a center electrode 21 made of a cylindrical conductor, an insulator 22 encircling the center electrode 21, and an external electrode 23 made of a conductor, such as metal, and encircling the insulator 22. Diameter of the center electrode 21 is ~10 nm, for example. Appropriate materials are: InAs, W, etc. for the center electrode 21; SiO$_2$, etc. for the insulator 22; and Al, etc. for the external electrode 23.

Figure 40:
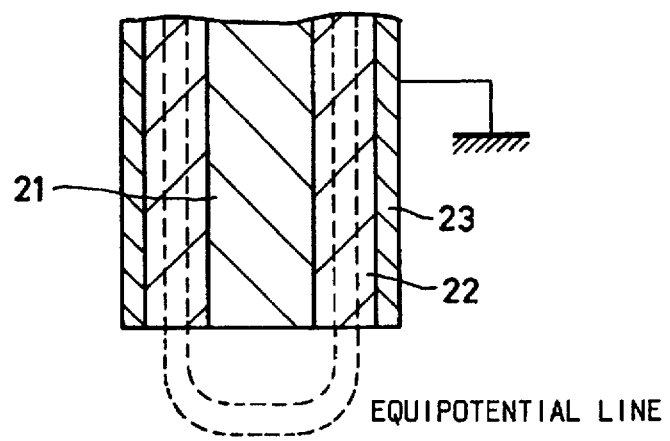
FIG. 40 is a cross-sectional view of needle electrode.
Figure 41:
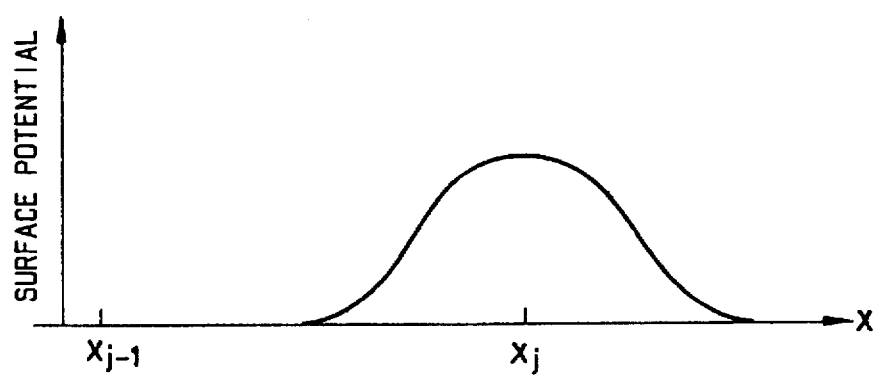
FIG. 41 is a schematic diagram showing a spatial distribution of the surface potential of a quantum memory with an external electric field applied through the needle electrode shown in FIGS. 39 and 40.

While the external electrode 23 of the needle electrode NE shown in FIG. 39 is held at zero potential by grounding, the potential distribution as shown in FIG. 40 appears around the distal end of the needle electrode NE when a predetermined voltage is applied to the center electrode 21, and the external electric field applied by the needle electrode NE is spatially localized. Therefore, when an external electric field is applied to a memory cell of a quantum memory by using the needle electrode NE, the external electric field applied to the surface of the quantum memory is also localized (FIG. 41). As a result, the distance between adjacent memory cells can be reduced, and so much dense integration of memory cells can be expected.

The needle electrode shown in FIGS. 39 and 40 can be fabricated by the method explained below as an example.

Figure 42:
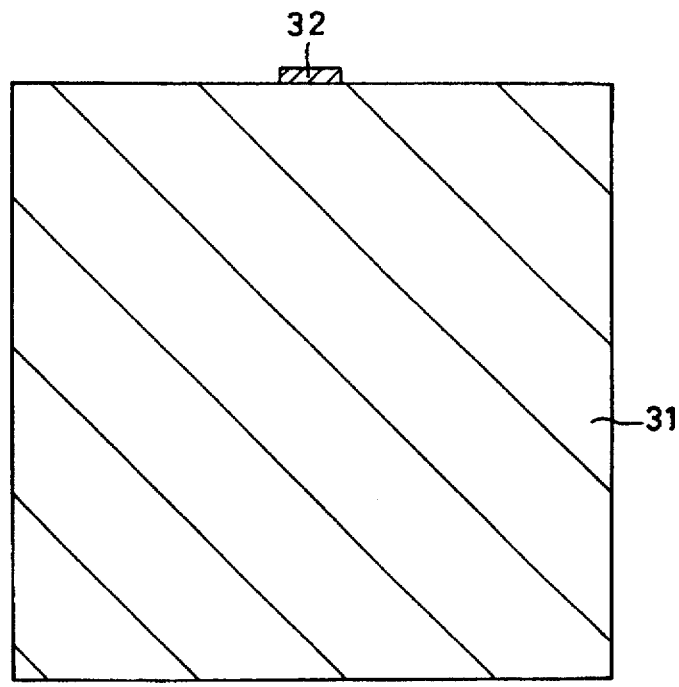
FIG. 42 is a cross-sectional view for explaining a process for manufacturing the needle electrode shown in FIGS. 39 and 40.

As shown in FIG. 42, made on an InAs substrate 31 is a circular resist pattern having the same diameter as that of the center electrode 21 to be made, that is, the diameter of ~10 nm, for example.

Figure 43:
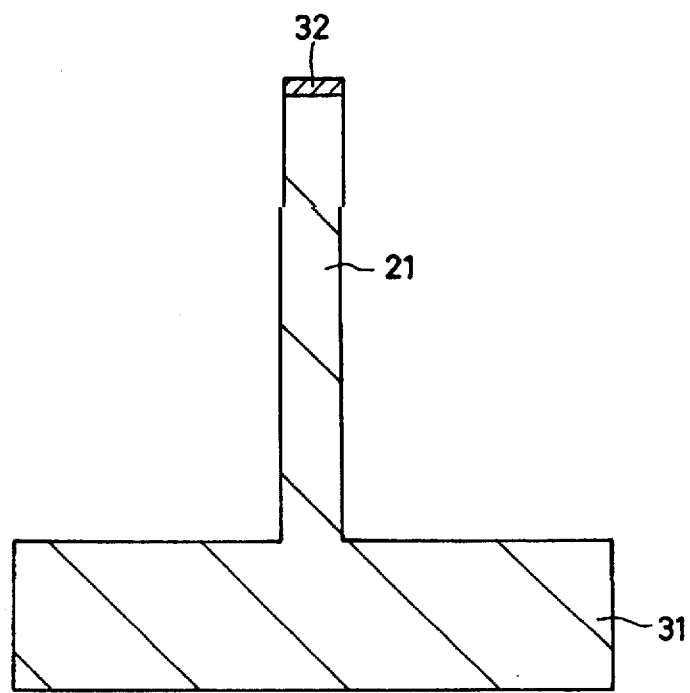
FIG. 43 is a cross-sectional view for explaining a process for manufacturing the needle electrode shown in FIGS. 39 and 40.

Referring to FIG. 43, by using the resist pattern 32 as a mask, the InAs substrate 31 is selectively etched off vertically of the plane of the substrate, by RIE, for example, to make a cylindrical pole of InAs as the center electrode 21, as shown in FIG. 43. Since InAs is free from surface depletion, its conductivity is not lost even by patterning into the diameter of about ~10 nm.

Figure 44:
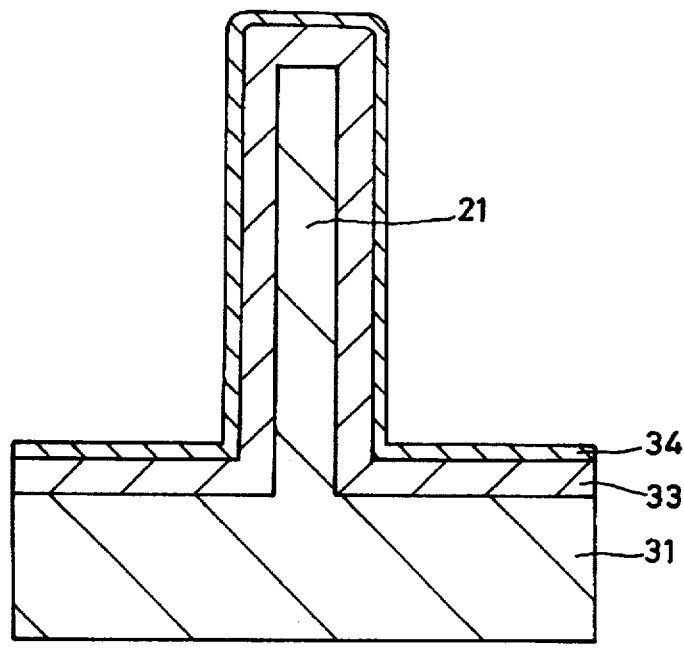
FIG. 44 is a cross-sectional view for explaining a process for manufacturing the needle electrode shown in FIGS. 39 and 40.

Next referring to FIG. 44, after a $SiO_2$ film 33, for example, is made on the entire surface by CVD, for example, an Al film 34, for example, is formed on the entire surface by vacuum evaporation or a like method.

Figure 45:
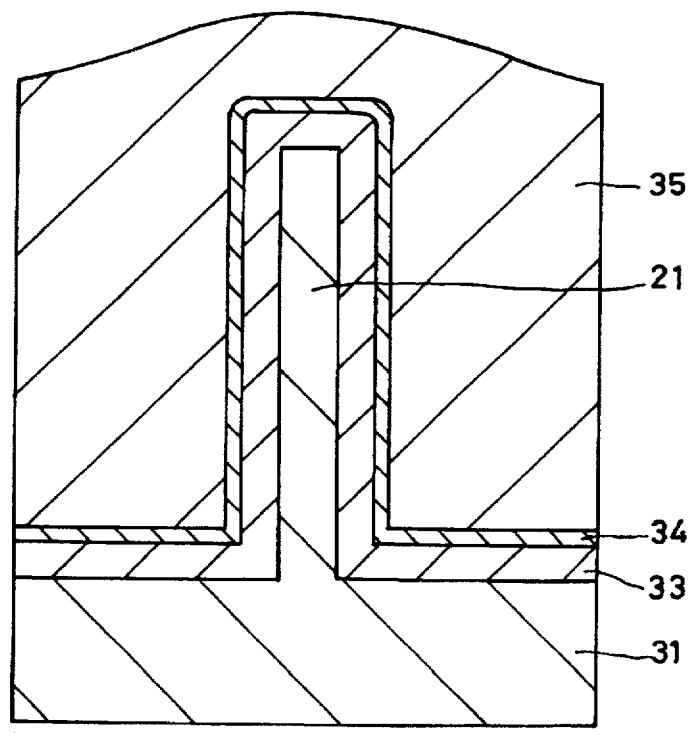
FIG. 45 is a cross-sectional view for explaining a process for manufacturing the needle electrode shown in FIGS. 39 and 40.
Figure 46:
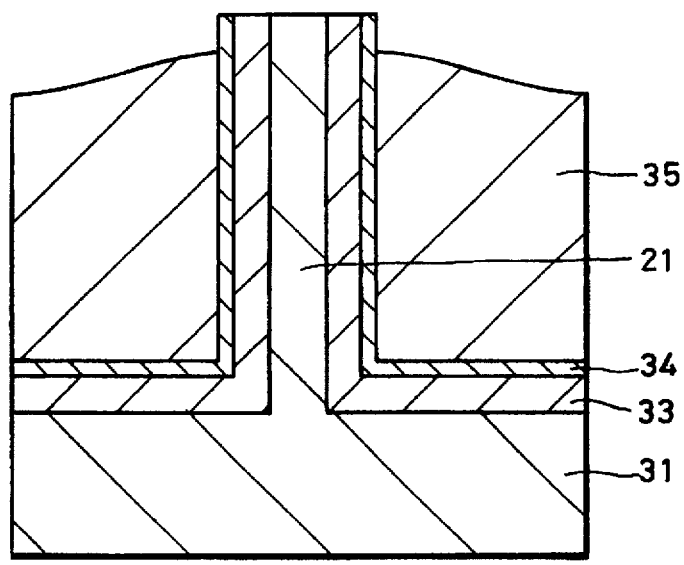
FIG. 46 is a cross-sectional view for explaining a process for manufacturing the needle electrode shown in FIGS. 39 and 40.

Next referring FIG. 45, after smoothing the surface by applying a sufficient thickness of organic resist 35, for example, the structure is etched back by RIE, for example, deep enough to expose at least the distal end of the center electrode 21. The appearance after being etched back is shown in FIG. 46.

Figure 47:
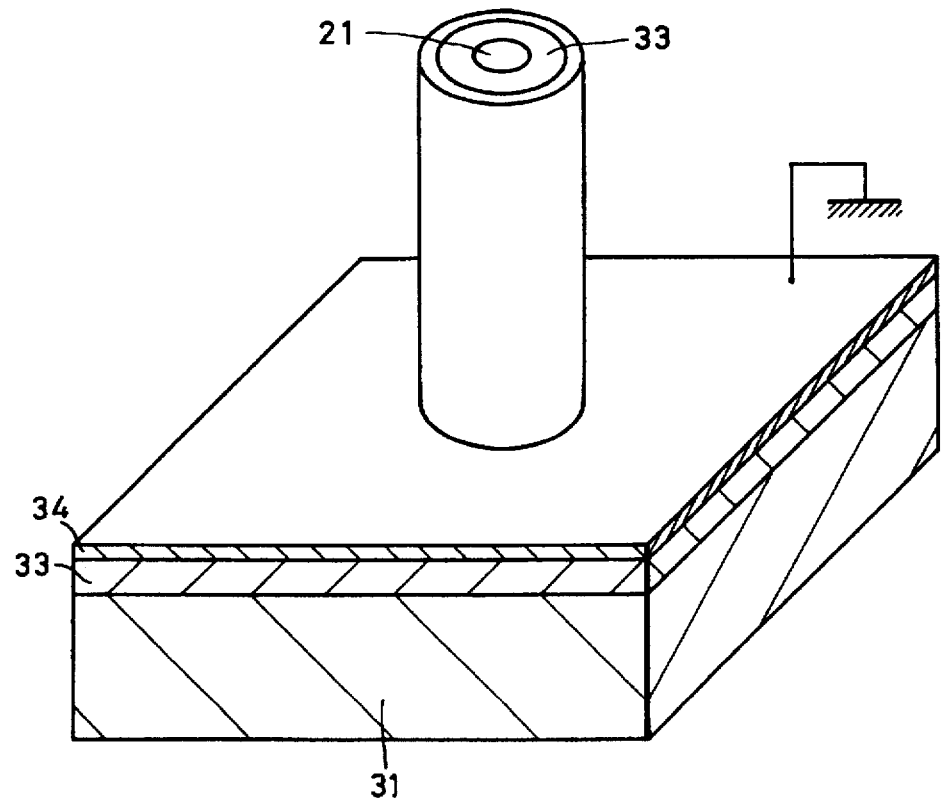
FIG. 47 is a perspective view of a finished needle electrode made by the manufacturing method shown in FIGS. 42 to 46.

After that, needless organic resist 35 is removed, to complete the needle electrode NE as shown in FIG. 47.

As already explained, when using the needle electrode NE, the Al film 34 as the external electrode 35 is grounded, and a predetermined voltage is applied to the InAs substrate 31.

The needle electrode NE shown in FIG. 39 can be fabricated also by the following method.

A Si substrate, for example, is used in lieu of the InAs substrate 31. W, for example, is selectively grown vertically on the surface of the Si substrate into a cylindrical rod to use is as the center electrode. Selective growth of W is attained, specifically, by introducing the Si substrate in an evacuated growth chamber; introducing $WF_6$ gas, for example, into the growth chamber; irradiating an electron beam with a sufficiently thinned beam diameter onto the surface of the Si substrate so as to cause decomposition of $WF_6$; and accumulating W on a site of the Si substrate surface exposed to the beam. After that, the process progresses in the same sequence as shown in FIGS. 44 to 46, to complete the desired needle electrode NE.

Figure 48:
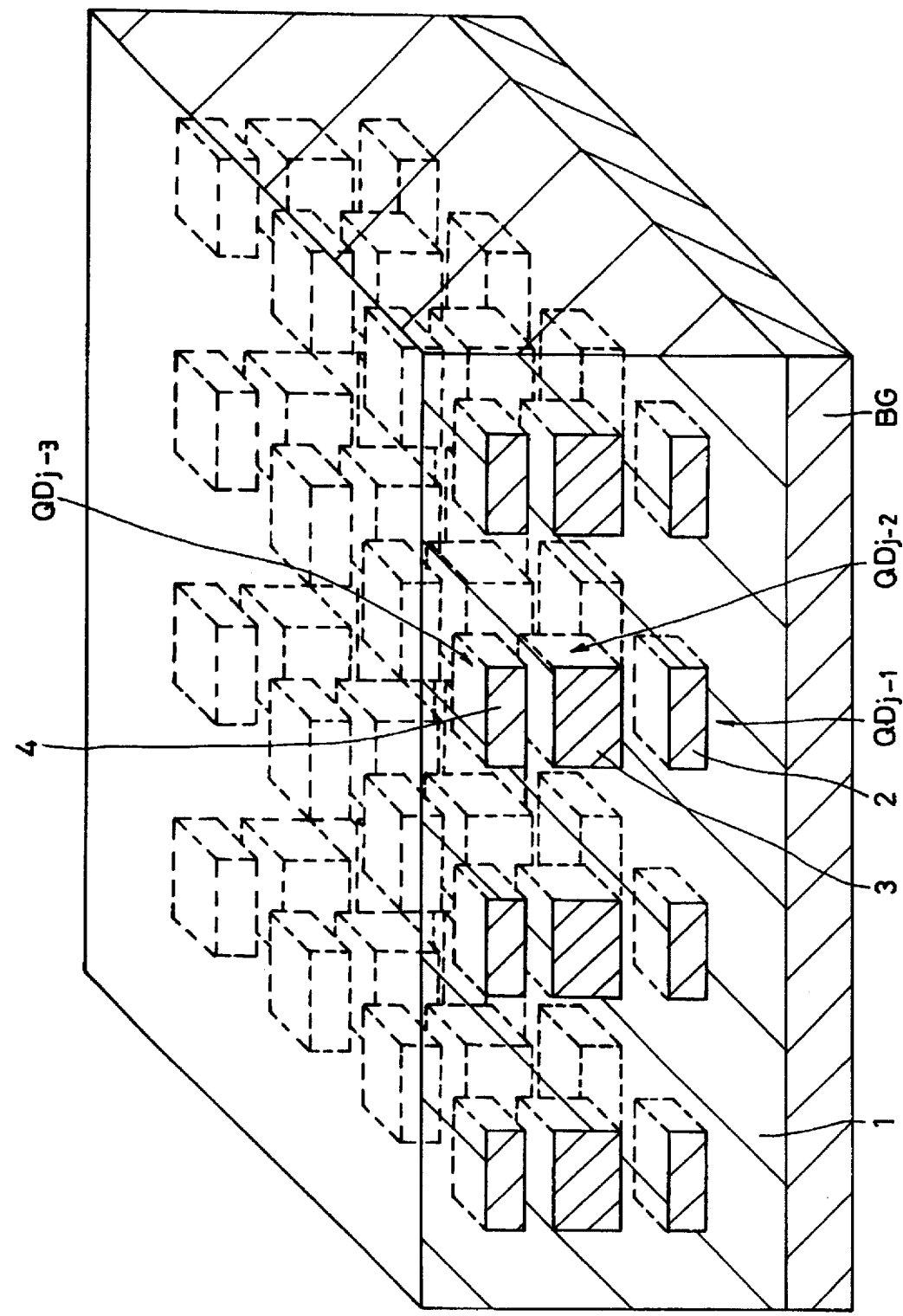
FIG. 48 is a perspective view of a quantum memory having a back gate for localizing an external electric field applied through a needle electrode.
Figure 49:
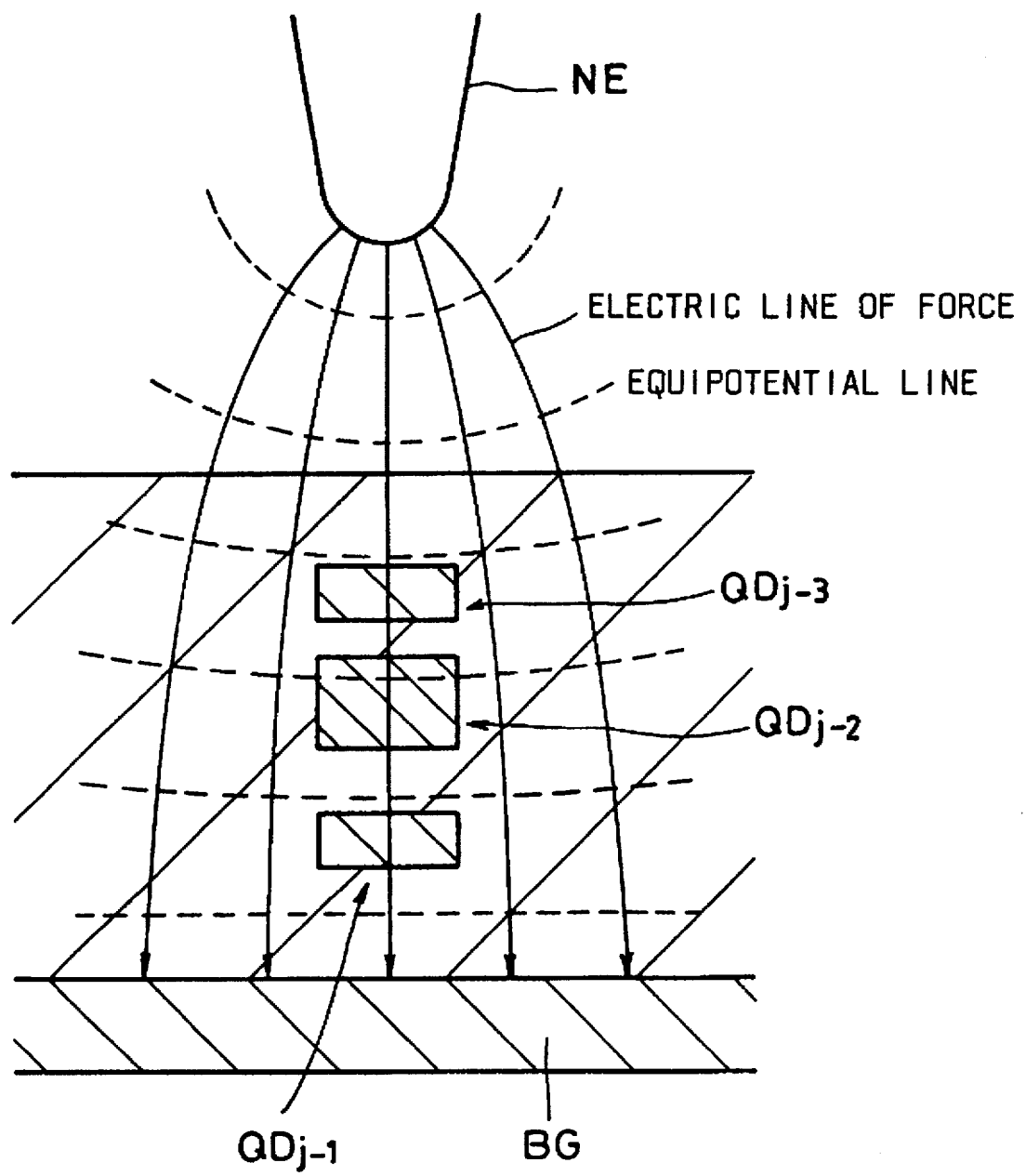
FIG. 49 is a schematic diagram showing a potential distribution with an external electric field applied by bringing a needle electrode close to the surface of the quantum memory shown in FIG. 48.

In order to spatially localize the external electric field applied by the needle electrode NE, apart from the use of the needle electrode NE as shown in FIGS. 39 and 40, it is also useful to provide a back gate of a conductive material on the opposite surface from that applied with the external electric field by the needle electrode NE. That is, a back gate BG as shown in FIG. 48 is made to the quantum memory, for example, of the first embodiment. By using the back gate, the external electric field applied by the needle electrode NE is screened by charges in the back gate BG; and in a quantum memory, the external electric field is confined in a narrow area. As a result, when the needle electrode NE is brought close to the surface of the quantum memory, the external electric field applied by the needle electrode NE is localized as shown in FIG. 49.

Figure 50:
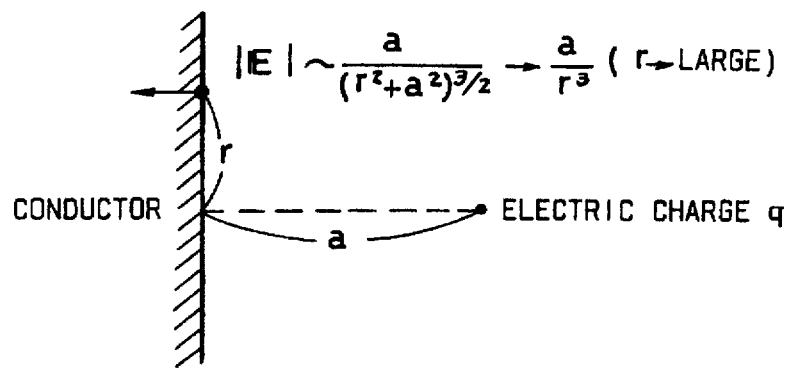
FIG. 50 is a schematic diagram for explaining reasons obtaining the potential distribution shown in FIG. 49.

The screening of the external electric field is explained below in greater detail. In general, inverse square law does not change in a dielectric body including vacuum. However, if any movable charge exists, when an external electric field is applied, the charge moves to cancel the external electric field, and screening occurs. That is, charges outside a conductor (back gate, in this case) causes dielectric charges in the conductor, and increases the attenuation ratio of the coulomb potential relative to the distance. As shown in FIG. 50, in a simplest system comprising a conductive flat plate and a single charge (q), the external electric field near the conductor surface changes by $(r^2+a^2)^{-3/2} \sim r^{-3}$ ($r \to \infty$), which represents that the attenuation rate is higher by one degree than $(r^2+a^2)^{-1} \sim r^{-2}$ ($r \to \infty$) of a system with no conductor. This attenuation is caused by the back gate, and the electric field in the dielectric body is also affected and localized by the change in potential.

A specific example of quantum memory having the back gate is explained below. Although the following explanation refers to the use of the back gate made to the quantum memory according to the first embodiment, it also applies to making the back gate to the quantum memory according to the second embodiment.

Figure 51:
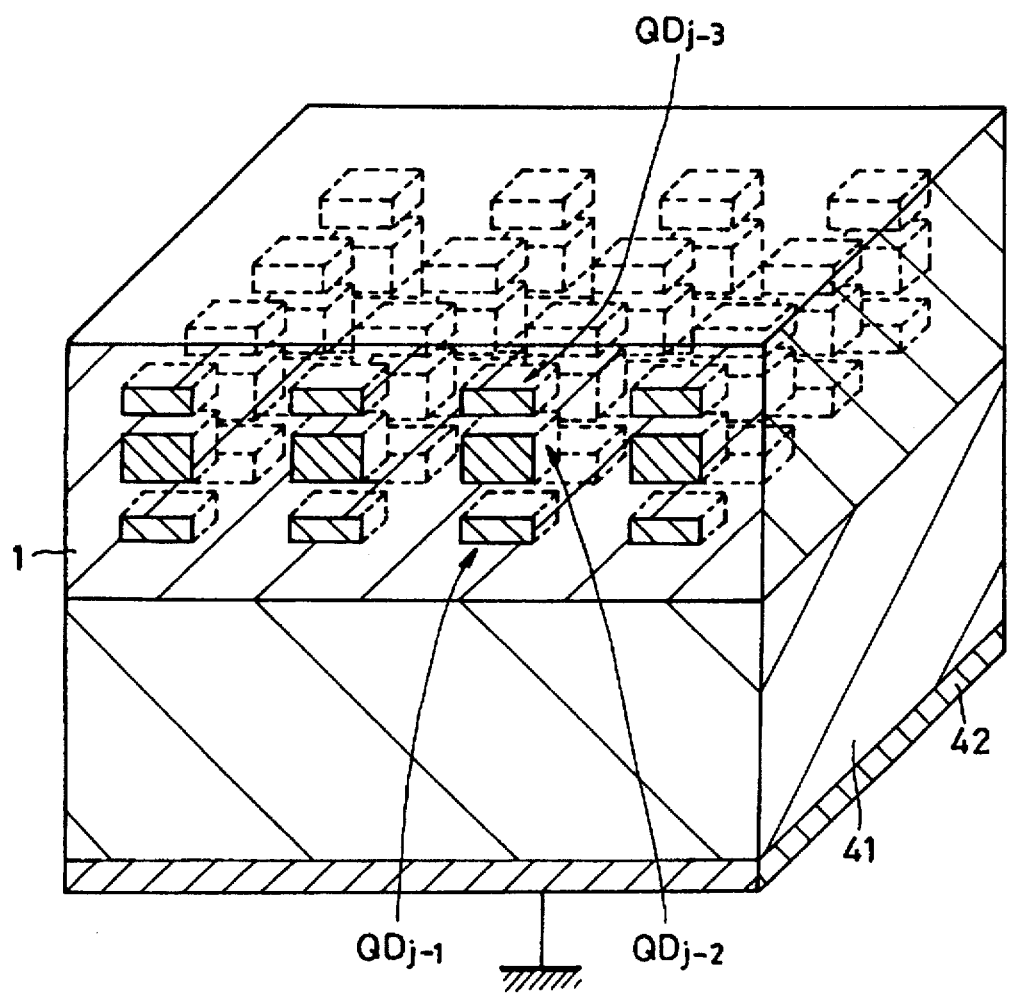
FIG. 51 is a perspective view of a first example of quantum memory having a back gate for localizing an external electric field applied through needle electrode; the preferable structure of a needle electrode.

In the first example shown in FIG. 51, an n-type GaAs substrate 41 is used as the substrate for fabricating the quantum memory, and a three-stage quantum dot array similar to that shown in FIG. 2 is formed on the n-type GaAs substrate 41. Made on the back surface of the n-type GaAs substrate 41 is an electrode 42 in ohmic contact with the n-type GaAs substrate 41. By grounding the electrode 42, the n-type GaAs substrate 41 is grounded. In this case, the n-type GaAs substrate 41 behaves as a back gate, and the AlGaAs layer 1 behaves as a layer for separating the back gate from the quantum dot array.

Figure 52:
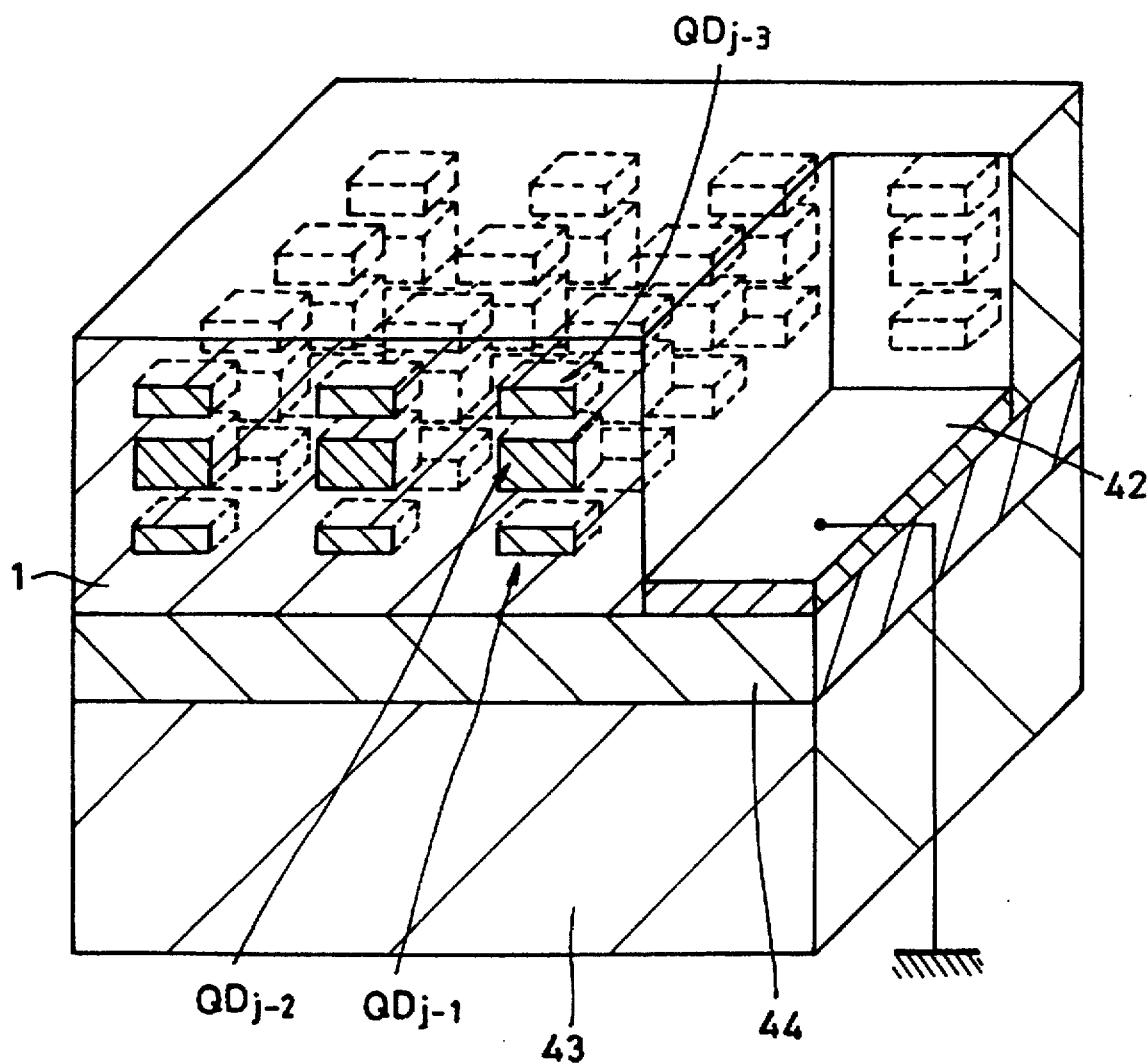
FIG. 52 is a perspective view of a second example of quantum memory having a back gate for localizing an external electric field applied through needle electrode.

In the second example shown in FIG. 52, a semi-insulating GaAs substrate 43 is used as the substrate for fabricating the quantum memory. After an n-type GaAs layer 44 is epitaxially grown on the semi-insulating GaAs substrate 43, a three-stage quantum dot array similar to that of FIG. 2 is formed on the n-type GaAs layer 44. After that, a part of the quantum dot array is etched off to expose the underlying part of the n-type GaAs layer 44. The electrode 42 is formed on the exposed n-type GaAs layer 44, and the n-type GaAs substrate 44 is grounded by grounding the electrode 42. In this case, the n-type GaAs layer 43 behaves as the back gate.

Figure 53:
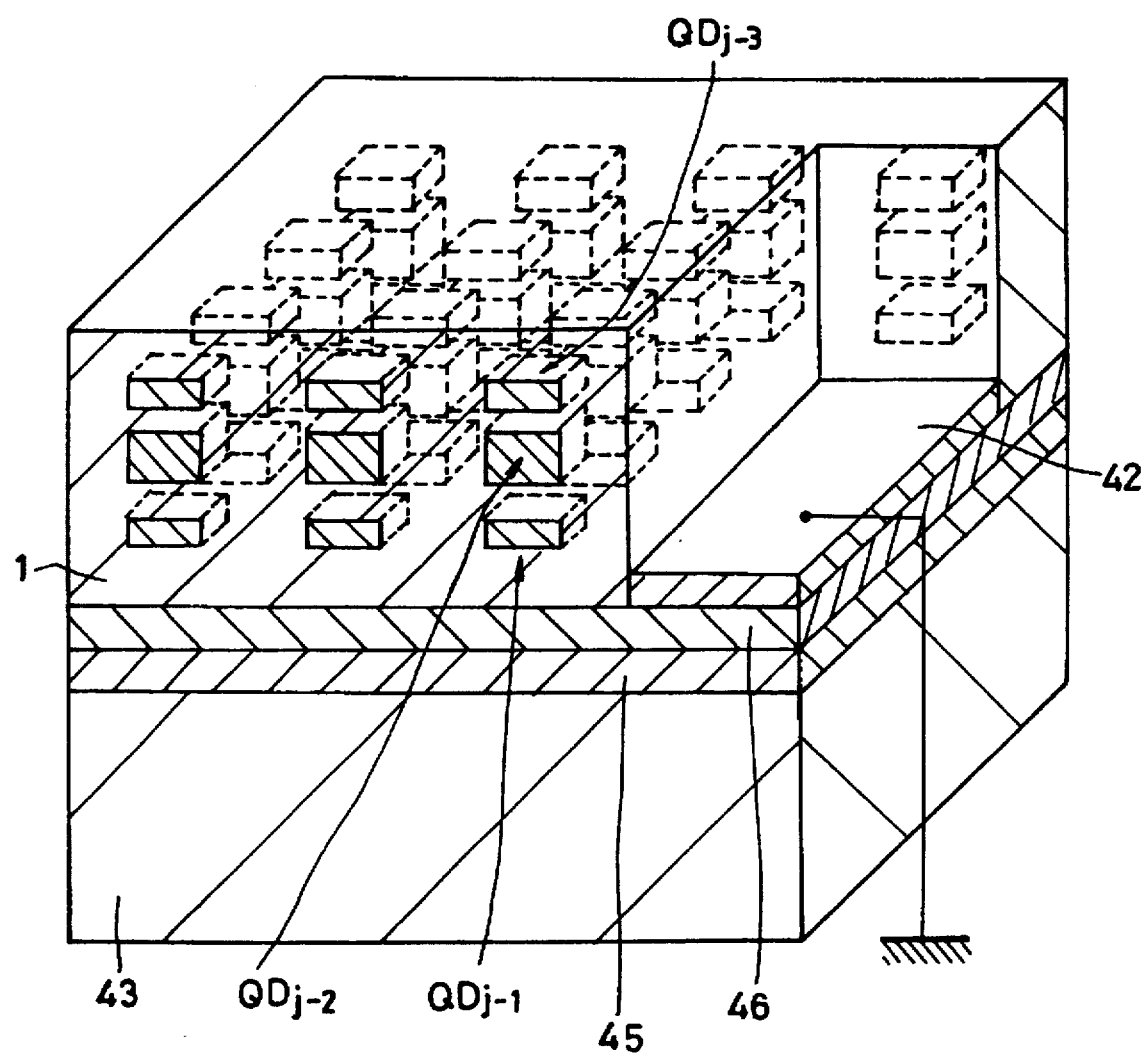
FIG. 53 is a perspective view of a third example of quantum memory having a back gate for localizing an external electric field applied through needle electrode.

In the third example shown in FIG. 53, a semi-insulating GaAs substrate 43 is used as the substrate for fabricating the quantum memory. After an n-type AlGaAs layer 45 and an i-type GaAs layer 46 are successively epitaxially grown on the semi-insulating GaAs substrate 43, a three-stage quantum dot array similar to that shown in FIG. 2 is formed on the i-type GaAs layer 46. After that, a part of the quantum dot array is etched off to expose the underlying part of the i-type GaAs layer 46. The electrode 42 is formed on the exposed i-type GaAs layer 46, and connected to ground. In this case, electrons are supplied from the n-type AlGaAs layer 45 into the i-type GaAs layer 46 along the heterojunction interface between the n-type AlGaAs layer 45 and the i-type GaAs layer 46, and a two-dimensional electron gas (2 DEG) is formed. Thereby, the i-type GaAs layer 46 is brought into ohmic contact with the electrode 42. In this case, the i-type GaAs layer 46 containing the 2 DEG behaves as the back gate.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

Figure 54:
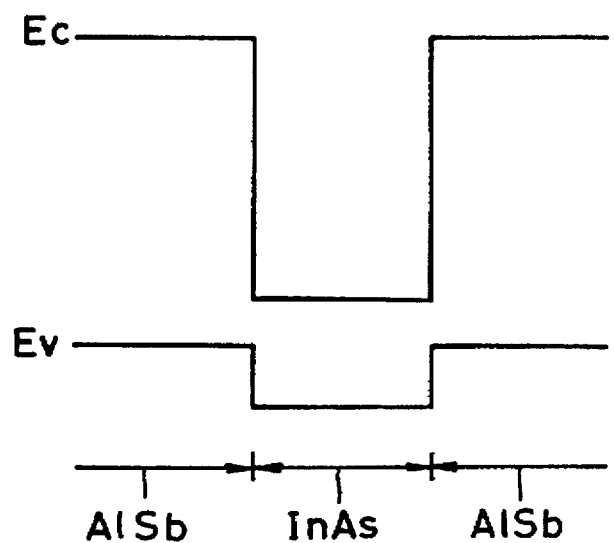
FIG. 54 is an energy band diagram of an AlSb/InAs heterojunction.
Figure 55:
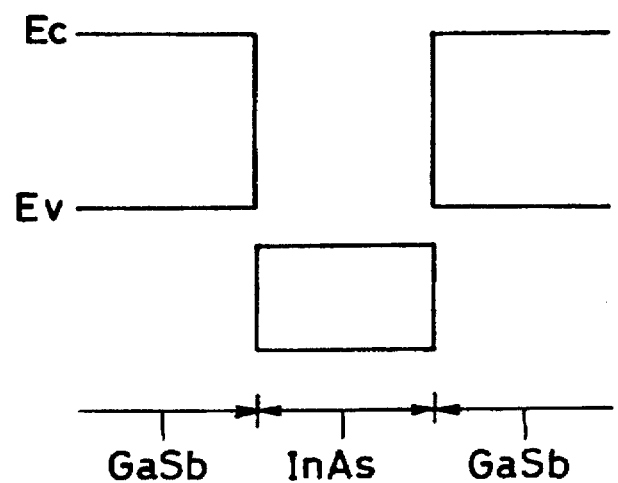
FIG. 55 is an energy band diagram of a GaSb/InAs heterojunction.

For example, although the quantum dots of the first and second embodiments comprise AlGaAs/GaAs heterojunctions or AlGaAs/InGaAs heterojunctions, they may be made of type-II heterojunction superlattices such as AlSb/InAs heterojunctions, GaSb/InAs heterojunctions or AlSb/GaSb heterojunctions. Energy band diagrams of the AlSb/InAs heterojunction and the GaSb/InAs heterojunction are shown in FIGS. 54 and 55 for reference.

As described above, drastically unlike existing semiconductor memory devices, the quantum memory according to the invention uses memory cells each comprising a first quantum box, second quantum box and third quantum box stacked in sequence, and can execute writing and reading by concurrently effecting irradiation of laser or other light and application of an external electric field through a needle electrode. This quantum memory attains an ultra-high rate of integration because of removal of wiring indispensable for existing semiconductor memory devices and remarkable reduction of the size of memory cells.

What is claimed is:

1. A quantum memory, comprising:
   a plurality of memory cells;
   each of said memory cells comprising a first quantum box, a second quantum box and a third quantum box which are stacked in sequence; and
   said first quantum box and said second quantum box being coupled by a coupling strength different from a coupling strength between said second quantum box and said third quantum box, and further satisfying the relationship:
   $E_0^{(j-1)} < E_0^{(j-2)}$
   $E_0^{(j-3)} < E_0^{(j-2)}$
   $(E_1^{(j-1)} - E_0^{(j-1)}) > (E_1^{(j-2)} - E_0^{(j-2)})$
   $(E_1^{(j-3)} - E_0^{(j-3)}) > (E_1^{(j-2)} - E_0^{(j-2)})$
   $(E_0^{(j-1)} - H_0^{(j-1)}) \neq (E_0^{(j-2)} - H_0^{(j-2)})$
   $(E_0^{(j-3)} - H_0^{(j-3)}) \neq (E_0^{(j-2)} - H_0^{(j-2)})$
   where $E_0^{(j-1)}$, $E_0^{(j-2)}$ and $E_0^{(j-3)}$ are ground-state energy levels of electrons in said first quantum box, said second quantum box and said third quantum box, respectively; $E_1^{(j-1)}$, $E_1^{(j-2)}$ and $E_1^{(j-3)}$ are first excited-state energy levels of electrons of said first quantum box, said second quantum box and said third quantum box, respectively; and $H_0^{(j-1)}$, $H_0^{(j-2)}$ and $H_0^{(j-3)}$ are ground-state energy levels of holes in said first quantum box, said second quantum box and said third quantum box, respectively.

2. The quantum memory according to claim 1 wherein, during writing, a first external electric field in the stacking direction of said first, second and third quantum boxes is applied to a memory cell chosen for writing while irradiating first light to said memory cell, and wherein, during reading, a second external electric field in the opposite direction from that of said first external electric field is applied to a memory cell chosen for reading while irradiating second light to said memory cell.

3. The quantum memory according to claim 2 wherein said first external electric field is applied by bringing a needle electrode applied with a predetermined voltage close to said memory cell chosen for writing.

4. The quantum memory according to claim 2 wherein initialization of a memory cell chosen for initialization is done by applying to said memory cell a third external electric field larger than said second external electric field to cause electron-hole recombination in said memory cell.

5. The quantum memory according to claim 1, wherein initialization of all said memory cells is done by increasing the temperature of said quantum memory to cause electron-hole recombination in all said memory cells.

6. The quantum memory according to claim 1 wherein said first quantum box, said second quantum box and said third quantum box are made of heterojunctions of compound semiconductors.

7. The quantum memory according to claim 6 wherein said heterojunctions of compound semiconductors are type-I heterojunction superlattices.

8. The quantum memory according to claim 6 wherein said heterojunctions of compound semiconductors includes heterojunctions selected from AlGaAs/GaAs heterojunctions or AlGaAs/InGaAs heterojunctions.

9. The quantum memory according to claim 6 wherein said heterojunctions of compound semiconductors are type-II heterojunction superlattices.

10. The quantum memory according to claim 6 wherein said heterojunctions of compound semiconductors include heterojunctions selected from AlSb/InAs heterojunctions, GaSb/InAs heterojunctions or AlSb/GaSb heterojunctions.

11. A quantum memory, comprising:
    a plurality of memory cells;
    each of said memory cells comprising a first quantum box, a second quantum box and a third quantum box which are stacked in sequence; and
    said first quantum box and said second quantum box being coupled by a coupling strength wherein said coupling strength between said second quantum box and said third quantum box is larger than said coupling strength between said first quantum box and said second quantum box and further satisfying the relationships:
    $E_0^{(j-1)} < E_0^{(j-2)}$
    $E_0^{(j-3)} < E_0^{(j-2)}$
    $(E_1^{(j-1)} - E_0^{(j-1)}) > (E_1^{(j-2)} - E_0^{(j-2)})$
    $(E_1^{(j-3)} - E_0^{(j-3)}) > (E_1^{(j-2)} - E_0^{(j-2)})$
    $(E_0^{(j-1)} - H_0^{(j-1)}) \neq (E_0^{(j-2)} - H_0^{(j-2)})$
    $(E_0^{(j-3)} - H_0^{(j-3)}) \neq (E_0^{(j-2)} - H_0^{(j-2)})$
    where $E_0^{(j-1)}$, $E_0^{(j-2)}$ and $E_0^{(j-3)}$ are ground-state energy levels of electrons in said first quantum box, said second quantum box and said third quantum box, respectively;
    $E_1^{(j-1)}$, $E_1^{(j-2)}$ and $E_1^{(j-3)}$ are first excited-state energy levels of electrons of said first quantum box, said second quantum box and said third quantum box, respectively;
    $H_0^{(j-1)}$, $H_0^{(j-2)}$ and $H_0^{(j-3)}$ are ground-state energy levels of holes in said first quantum box, said second quantum box and said third quantum box, respectively; and
    wherein said first, second and third quantum boxes are made of heterojunctions of compound semiconductors.

12. A method of writing to a quantum memory cell, comprising the steps of:
    providing a quantum memory cell comprising a first, second and third quantum box stacked in sequence each of said memory cells comprising a first quantum box, a second quantum box and a third quantum box which are stacked in sequence; and
    said first quantum box and said second quantum box being coupled by a coupling strength wherein said coupling strength between said second quantum box and said third quantum box is larger than said coupling strength between said first quantum box and said second quantum box and further satisfying the relationships:

$$E_0^{(j-1)} < E_0^{(j-2)}$$
$$E_0^{(j-3)} < E_0^{(j-2)}$$
$$(E_1^{(j-1)} - E_0^{(j-1)}) > (E_1^{(j-2)} - E_0^{(j-2)})$$
$$(E_1^{(j-3)} - E_0^{(j-3)}) > (E_1^{(j-2)} - E_0^{(j-2)})$$
$$(E_0^{(j-1)} - H_0^{(j-1)}) \neq (E_0^{(j-2)} - H_0^{(j-2)})$$
$$(E_0^{(j-3)} - H_0^{(j-3)}) \neq (E_0^{(j-2)} - H_0^{(j-2)})$$

where $E_0^{(j-1)}$, $E_0^{(j-2)}$ and $E_0^{(j-3)}$ are ground-state energy levels of electrons in said first quantum box, said second quantum box and said third quantum box, respectively;

$E_1^{(j-1)}$, $E_1^{(j-2)}$ and $E_1^{(j-3)}$ are first excited-state energy levels of electrons of said first quantum box, said second quantum box and said third quantum box, respectively;

$H_0^{(j-1)}$, $H_0^{(j-2)}$ and $H_0^{(j-3)}$ are ground-state energy levels of holes in said first quantum box, said second quantum box and said third quantum box, respectively; and wherein said first, second and third quantum boxes are made of heterojunctions of compound semiconductors;

applying a first electric field of a first polarity to said quantum memory cell in the stacking direction of said first, second and third quantum boxes;

simultaneous with said applying step, irradiating said memory cell with light.

13. The method of claim 12, further comprising reading said memory cell by the steps of applying a second electric field having polarity opposite that of said first polarity while simultaneously irradiating said memory cell with light.

14. The method of claim 12, wherein said step of applying said first electric field includes the step of bringing a needle electrode at a first predetermined voltage close to said memory cell.

15. The method of claim 12, wherein said step of applying said second electric field includes the step of bringing a needle electrode at a second predetermined voltage close to said memory cell.

16. The method of claim 13, further comprising initializing said memory cell by the step of applying a third electric field to said memory cell, said third electric field being of greater strength than said second electric field.

17. The method of claim 13, further comprising initializing said memory cell by the step of applying said second electric field to said memory cell for a time longer than that for reading said memory cell in order to cause electron-hole recombination in said memory cell.

18. The method of claim 12, further comprising initializing said memory cell by the step of increasing the temperature of said quantum memory cell to cause electron-hole recombination.

19. The method of claim 12, wherein said providing step includes the step of forming said first quantum box, said second quantum box and said third quantum box of heterojunctions of compound semiconductors.

20. The method of claim 19, wherein said heterojunctions of compound semiconductors include type-I heterojunction superlattices.

21. The method of claim 20, wherein said heterojunctions of compound semiconductors include heterojunctions selected from AlGaAs/GaAs heterojunctions or AlGaAs/InGaAs heterojunctions.

22. The method of claim 19, wherein said heterojunctions of compound semiconductors include type-II heterojunction superlattices.

23. The method of claim 22, wherein said heterojunctions of compound semiconductors include heterojunctions selected from AlSb/InAs heterojunctions, GaSb/InAs heterojunctions and AlSb/GaSb heterojunctions.

24. The quantum memory according to claim 2 wherein said second external electric field is applied by bringing a needle electrode applied with a predetermined voltage close to said memory cell chosen for reading.

25. The quantum memory according to claim 2 wherein initialization of a memory cell chosen for initialization is done by applying to said memory cell said second external electric field for a time longer than that for reading in order to cause electron-hole recombination in said memory cell.

26. The quantum memory according to claim 1, wherein initialization of all said memory cells is done by irradiating third light to said quantum memory to cause electron-hole recombination in all said memory cells.

* * * * *